United States Patent [19]

Bergemont

[11] Patent Number: 5,402,372
[45] Date of Patent: Mar. 28, 1995

[54] HIGH DENSITY EEPROM CELL ARRAY WITH IMPROVED ACCESS TIME AND METHOD OF MANUFACTURE

[75] Inventor: Albert M. Bergemont, San Jose, Calif.

[73] Assignee: National Semiconductor Corporation, Santa Clara, Calif.

[21] Appl. No.: 152,408

[22] Filed: Nov. 15, 1993

Related U.S. Application Data

[63] Continuation-in-part of Ser. No. 891,705, Jun. 1, 1992.

[51] Int. Cl.$^6$ ................................................ G11C 8/00
[52] U.S. Cl. ................................ 365/185; 365/230.06; 257/321
[58] Field of Search ................... 257/321, 322, 316; 365/185, 63, 230.06

[56] References Cited

U.S. PATENT DOCUMENTS

| | | | |
|---|---|---|---|
| 4,258,466 | 3/1981 | Kuo et al. | 29/571 |
| 4,377,818 | 3/1983 | Kuo et al. | 257/316 |
| 4,598,460 | 7/1986 | Owens et al. | 257/316 |
| 4,804,637 | 2/1989 | Smayling et al. | 437/52 |
| 4,822,750 | 4/1989 | Perlegos et al. | 437/52 |
| 4,851,365 | 7/1989 | Jeuch | 437/43 |
| 4,947,222 | 8/1990 | Gill et al. | 257/316 |
| 4,979,005 | 12/1990 | Mitchell | 257/316 |
| 5,012,307 | 4/1991 | Gill et al. | 257/316 |
| 5,017,980 | 3/1991 | Gill et al. | 257/321 |
| 5,051,796 | 9/1991 | Gill | 257/316 |
| 5,057,886 | 10/1991 | Riemenschneider et al. | 257/316 |
| 5,081,054 | 1/1992 | Wu et al. | 437/43 |
| 5,120,670 | 6/1992 | Bergmont | 437/43 |
| 5,156,990 | 10/1992 | Mitchell | 257/316 |
| 5,204,835 | 4/1993 | Eitan | 365/185 |

FOREIGN PATENT DOCUMENTS

| | | | |
|---|---|---|---|
| 0356346 | 2/1990 | European Pat. Off. | H01L 27/10 |
| 57-106079 | 10/1982 | Japan | H01L 29/78 |
| 1-27245 | 1/1989 | Japan | H01L 21/90 |
| 2-132862 | 5/1990 | Japan | H01L 29/788 |
| 2-284473 | 11/1990 | Japan | H01L 29/788 |
| 0436156 | 7/1991 | Japan | H01L 29/62 |
| 2073488 | 10/1981 | United Kingdom | H01L 29/78 |
| WO90/11621 | 10/1990 | WIPO | H01L 29/788 |

OTHER PUBLICATIONS

Boaz Eitan, R. Kazerounian and A. Bergemont, "Alternate Metal Virtual Ground (AMG)–A New Scaling Concept for Very High–Density EPROM's", IEEE Electron Device Letters, vol. 12, No. 8, Aug. 1991, New York, U.S., pp. 450–452.

Kuniyoshi Yoshikawa et al., "An Asymmetrical Lightly Doped Source Cell for Virtual Ground High–Density EPROM's", IEEE Transactions on Electron Devices, vol. 37, No. 4, Apr. 1990, pp. 1046–1051.

*Primary Examiner*—Robert P. Limanek
*Attorney, Agent, or Firm*—Limbach & Limbach

[57] ABSTRACT

The memory array of a high density, electrically-erasable, programmable read-only-memory (EEPROM) is divided into a series of segments which are individually accessible via a plurality of segment select transistors. When a specific memory cell or cells is to be read, only the segment select transistors which correspond to the segment of memory which contains the specific memory cell or cells are turned on. As a result, the time required to access the specific memory cell or cells can be significantly reduced.

7 Claims, 16 Drawing Sheets

HIGH DENSITY EEPROM CELL ARRAY WITH IMPROVED ACCESS TIME AND METHOD OF MANUFACTURE

RELATED APPLICATIONS

This application is a continuation-in-part of co-pending application Ser. No. 07/891,705, filed on Jun. 1, 1992, by Albert Bergemont for HIGH DENSITY EEPROM CELL ARRAY WITH NOVEL PROGRAMMING SCHEME AND METHOD OF MANUFACTURE.

BACKGROUND OF THE INVENTION

1. Field of the Invention

The present invention relates to a high density electrically-erasable, programmable read-only-memory (EEPROM) device and, in particular, to a high-density EEPROM device that reduces the time required to read a memory cell or cells of the device.

2. Discussion of the Prior Art

The basic, fundamental challenge in creating an electrically-erasable programmable read only memory (EEPROM) cell is to use a controllable and reproducible electrical effect which has enough nonlinearity so that the memory cell can be written or erased at one voltage in less than 1 ms and can be read at another voltage, without any change in the programmed data for more than 10 years. Fowler-Nordheim tunneling, which was first described by Fowler and Nordheim in 1928, exhibits the required nonlinearity and has been widely used in EEPROM memories.

In silicon (Si), the energy difference between the conduction band and the valence band is 1.1 eV. In silicon dioxide ($SiO_2$), the energy difference between these bands is about 8.1 eV, with the conduction band in $SiO_2$ 3.2 eV above that in Si. Since electron energy is about 0.025 eV at thermal room temperature, the probability that an electron in Si can gain enough thermal energy to surmount the Si-to-$SiO_2$ barrier and enter the conduction band in $SiO_2$ is very small. If electrons are placed on a polysilicon floating gate surrounded by $SiO_2$, then this band diagram will by itself insure the retention of data.

Fowler-Nordheim emission, which was observed early in this century for the case of electron emission from metals into vacuums, was also observed by Lenzliger and Snow in 1969 for electron emission from silicon to silicon dioxide. In the presence of a high electric field at the Si—$SiO_2$ interface, the energy bands will be distorted and there is a small, but finite, probability that an electron in the conduction band of the Si will quantum mechanically tunnel through the energy barrier and emerge in the conduction band of the $SiO_2$.

The tunneling current increases exponentially with the applied field in accordance with the following general current density expression:

$$J=(AE2)exp(-B/E)$$

where A and B ar constants, and

E is the field at the Si—SiO2 interface

This current is observable at a current density of 10E-6 A/cm2 when the field at the Si—$SiO_2$ interface is about 10 MV/cm. Local fields of this magnitude, at voltages practicable for use in microelectronics, can be obtained by applying a voltage across either a thin (about 100 Å) oxide grown on bulk silicon or across thicker (about 500 Å) oxide grown on polysilicon. In the latter case, the field enhancement arises from textured polysilicon formation, i.e. positive curvature regions at the polysilicon—polysilicon oxide interface resulting in tunneling enhancement at similar voltages as in the first case.

The theoretically ideal EEPROM memory cell comprises a single transistor addressable by applying electrical signals to a specified row and a specified column of the memory array matrix. For example, to write a logic "1" or a logic "0" into a cell of this "ideal" cell, a voltage is applied to the control gate corresponding to the row (word line) of the selected cell while a voltage corresponding to either a "1" or a "0" is applied to the source or drain corresponding to the column (bit line) of the selected cell.

An important problem encountered in attempts to realize this "ideal" cell is the need for an additional access transistor in each memory cell to enable selection of a single row of memory cells while changing data in the selected cell without accidentally writing or erasing memory in other rows. Unfortunately, the presence of an additional access transistor in each memory cell increases the size of the cell and leads to impractical die size for high density Megabit memory arrays.

It is, therefore, a goal to provide an EEPROM cell which does not require an additional distinct access transistor in each memory cell to provide reliable selection of a single cell for changing data while precluding accidental simultaneous programming or erasure in non-selected cells.

The basic concept of the well-known FLOTOX EEPROM memory cell is shown in FIG. 1. In the FLOTOX cell, the tunnel oxide, which typically is less than 100 Å thick, is grown over an area defined photolithographically in the drain region (or an extension of the drain region, called buried N+). Charging of the floating gate to program the cell is achieved by grounding the source and the drain and applying a high voltage to the control gate. The FLOTOX cell is designed such that a large fraction of the applied voltage is coupled across the tunnel oxide resulting in the transport of electrons from the drain to floating gate. Discharge of the floating gate to erase the cell is achieved by grounding the control gate, floating the source and applying a high voltage to the drain. In this case, most of the applied voltage is coupled across the tunnel oxide, but the field is reversed, resulting in tunneling of electrons from the floating gate to the drain. The source is floated so that there is no continuous current path, an important factor when an internal charge pump is used to generate the high voltage from a $\leq 5$ V supply.

If a single transistor memory cell is placed in a typical array with drains connected to metal columns and gates connected to common polysilicon word lines, the erasing of the cell, with the word line grounded, will mean that high voltage is applied to all drains in a common column. Erasing can be inhibited in non-selected cells by taking unselected word lines to a high voltage. However, this means that unselected cells along the same word line may be programmed. To avoid such disturb conditions, as shown in FIG. 1, the FLOTOX cell utilizes a distinct access transistor to isolate the drain from the column bit line. The access transistor is off for rows that are not selected.

FIG. 2 provides a layout of the FIG. 1 FLOTOX cell, with the FIG. 1 cross section being taken perpendicular to the word line (control gate) and through the tunnel oxide window.

E. K. Shelton, "Low-power EE-PROM can be reprogrammed fast", Electronics, Jul. 31, 1980, pp. 89–92, discloses a basic EEPROM concept similar to the above-described FLOTOX concept. However, as shown in FIG. 3, instead of a tunnel oxide area defined lithographically over the drain (buried N+), the Shelton cell has its tunnelling area defined in the channel under the polysilicon floating gate. The polysilicon floating gate partially spans the drain side of the channel, while the remainder of the channel (source side) is spanned by an overlying aluminum control gate. The aluminum control gate is insulated from the polysilicon floating gate by a thin silicon nitride layer.

Furthermore, the Shelton memory cell is formed in a P-well on a N-substrate. Controlling the P-well potential allows the elimination of the distinct access transistor in each memory cell. The potential of the P-well and the sources and drains of the unselected cells are chosen during programming operations to prevent minority carriers from discharging any of the floating gates to the substrate while permitting an individual selected floating gate to be programmed.

Programming of the FIG. 3 cell is achieved by grounding the P-well and connecting the drain through a load resistance to the programming voltage. The source is connected to either the programming voltage or to ground depending upon whether a "1" or a "0" is to be stored. To initiate programming, the aluminum control gate is connected to the high voltage. If the source potential is also connected to the high voltage, then the internal access transistor doesn't turn on and the surface of the P-well below the floating gate is depleted of electrons. Only a small potential difference exists between the surface of the P-well and the floating gate. Therefore, no electrons tunnel into the gate and the cell remains in a 0 state. If the source terminal is connected to ground (to program a 1), then the internal access transistor turns on, the surface potential under the floating gate drops to close to 0 V, and electrons from the inversion layer tunnel through the thin oxide into the floating gate.

The FIG. 3 cell is erased by grounding the control gate and then raising the P-well to the programming voltage. This causes electrons to tunnel from the floating gate to the P-well via the tunnel oxide. As electrons tunnel through the tunnel oxide, the floating gate acquires a net positive charge.

Although the FIG. 3 Shelton cell differs from the FIG. 1 FLOTOX cell in that it does not utilize a distinct access transistor, it does require an internal access transistor and, thus, also requires a relatively large cell size.

As stated above, this application is a continuation-in-part of co-pending application Ser. No. 07/891,705. In the co-pending application, a memory cell is described wherein neither a distinct access transistor (as in the FLOTOX cell) nor an internal access transistor (as in the Shelton cell) is required to isolate a memory cell, which has been selected to be programmed, from an adjacent memory cell, which has not been selected to be programmed. As a result, the die size of a high-density EEPROM array constructed from the memory cells described in the co-pending application is smaller than the die size of an EEPROM array constructed from either the FLOTOX or Shelton cells.

As is well known, the time required to read a memory cell can be a significant factor in the selection of an EEPROM device. Although the memory cell described in the co-pending application eliminates the need for a distinct access transistor and an internal access transistor, the time required to read a cell, regardless of the cell type utilized to construct the array, remains substantially the same. Thus, there is a need for an EEPROM array that significantly reduces the time required to read a cell.

SUMMARY OF THE INVENTION

The present invention provides a high-density, electrically-erasable, programmable read-only-memory (EEPROM) array that significantly reduces the time required to read a cell within the array by utilizing segment select circuitry to divide the EEPROM array into a series of segments which can be individually accessed, thereby significantly reducing the time required to read the cell.

In accordance with the present invention, an EEPROM array is fabricated by starting with a semiconductor material of P-type conductivity that has a plurality of adjacent segment select regions and a plurality of adjacent array regions that are arranged so that one array region is located between and adjoins each pair of adjacent segment select regions. Next, a plurality of strips of first field oxide are formed on the semiconductor material so that a portion of each strip is formed in each segment select region and in each array region. Each strip of first field oxide is formed to define a plurality of segment select transistor regions in each segment select region. In addition, each pair of adjacent strips of first field oxide in each array region define a P-type active device region therebetween. After the plurality of strips of first field oxide have been formed, a plurality of buried bit lines are formed in the semiconductor material so that a portion of each buried bit line is formed in each pair of adjacent segment select regions and the adjoining array region located therebetween. The portion of each buried bit line that is formed in the array region is formed in the P-type active device region adjacent to one of the strips of first field oxide. The portion of each buried bit line that is formed in the adjoining segment select regions are formed so that the portion adjoins one of the segment select transistor regions. Following this, a layer of second field oxide is formed on the semiconductor material over each buried bit line. Next, a plurality of channel regions are defined in each of the P-type active device regions, and then implanted with a P-type material to set a threshold voltage. After the channel regions have been implanted, a layer of first gate dielectric material is formed on the semiconductor material. Once the layer of first gate dielectric material has been formed, a layer of tunnel dielectric material is formed in the layer of first gate dielectric material over each channel region so that the thickness of the tunnel dielectric material is less than the thickness of the first gate dielectric material. Next, a layer of first conductive material is deposited over the layer of first gate dielectric material and the layer of tunnel dielectric material. Following this, a layer of intermediate dielectric material is formed over the layer of first conductive material. The layer of intermediate dielectric material and the layer of first conductive material are then etched to define a plurality of strips of dielectric/conductive material in each of the array regions so that each strip of dielectric/conductive material is formed over one P-type active device region. After this, the layer of first gate dielectric is removed from each of the segment select regions. Next, a plurality of channel regions are defined in each of the segment select regions and then implanted with a P-type material to set a threshold voltage. Once the threshold voltages in the segment select regions are set, a layer of second gate dielectric material is formed over the semiconductor material in each of the segment select regions. Following this, a layer of second conductive material is deposited over each segment select region and over each array region, followed by the deposition of a layer of third conductive material over the layer of second conductive material. The layer of third conductive material and the layer of second conductive material are then etched to form segment select lines in each segment select region, and to form word lines in each array region. Next, the layer of intermediate dielectric material and the layer of first conductive material are etched to form a plurality of floating gate memory cells in each array region. The segment select transistors are then fabricated by forming an N+ drain region and an N+ source region on opposite sides of each segment select line in each segment select transistor region so that each N+ source region contacts one buried bit line.

A better understanding of the features and advantages of the present invention will be obtained by reference to the following detailed description of the invention and accompanying drawings which set forth an illustrative embodiment in which the principals of the invention are utilized.

DETAILED DESCRIPTION OF THE INVENTION

FIGS. 4-7 illustrate the steps for fabricating a high density EEPROM cell in accordance with the parent application.

Figure 1:
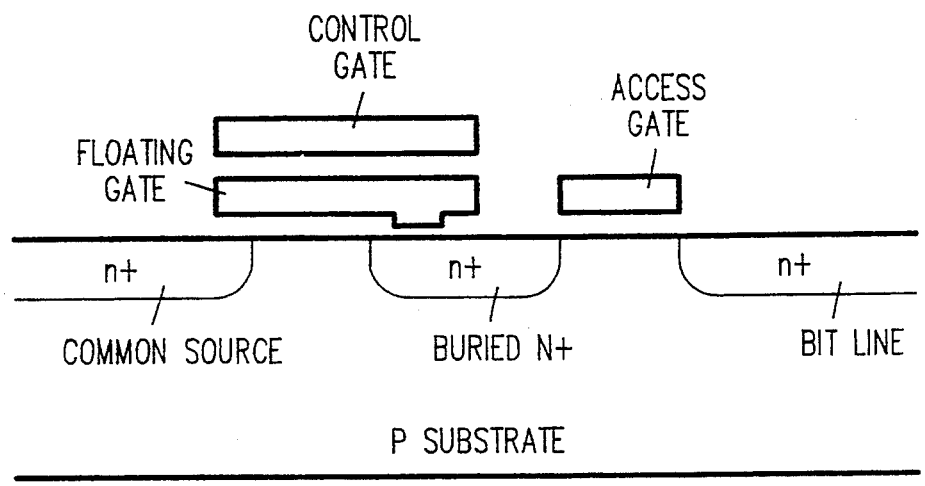
FIG. 1 is a cross-section drawing illustrating a conventional EEPROM cell structure that utilizes a distinct access transistor.
Figure 2:
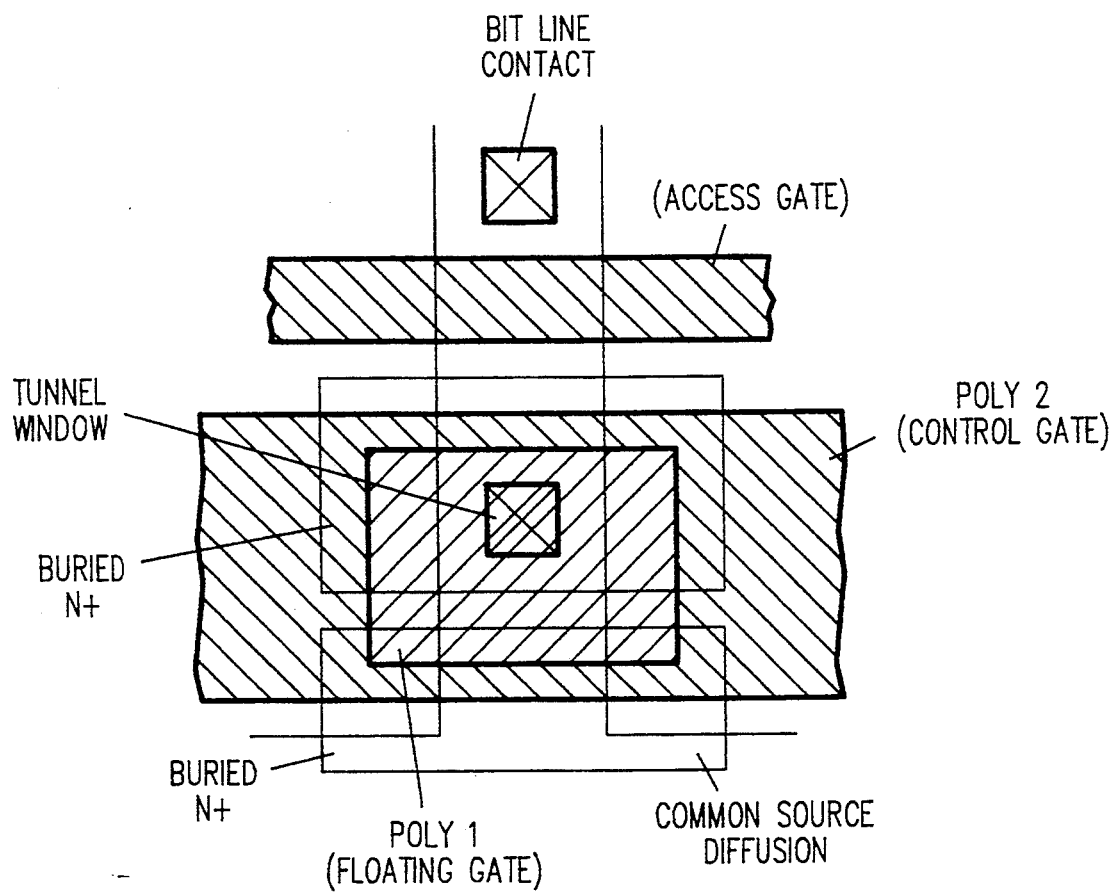
FIG. 2 is a layout illustrating the FIG. 1 cell structure.
Figure 3:
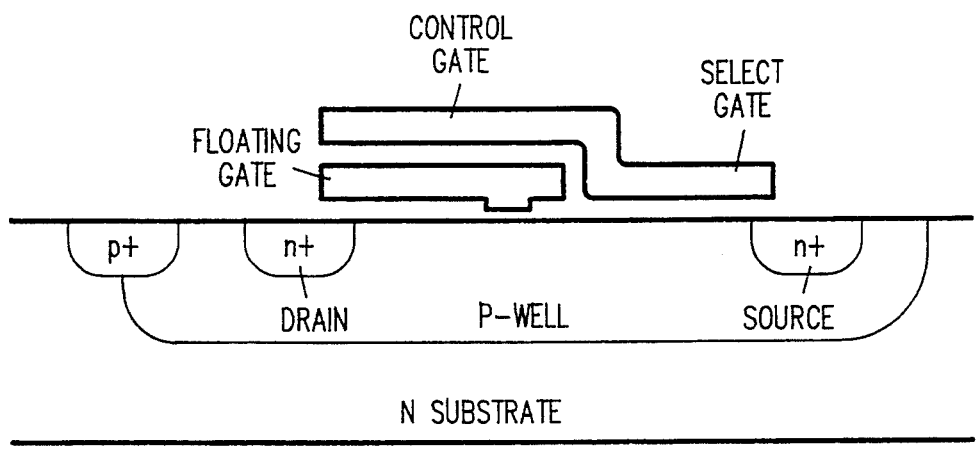
FIG. 3 is a cross-section drawing illustrating a prior art EEPROM cell that is fabricated on a P-well and utilizes an internal access transistor.
Figure 4:
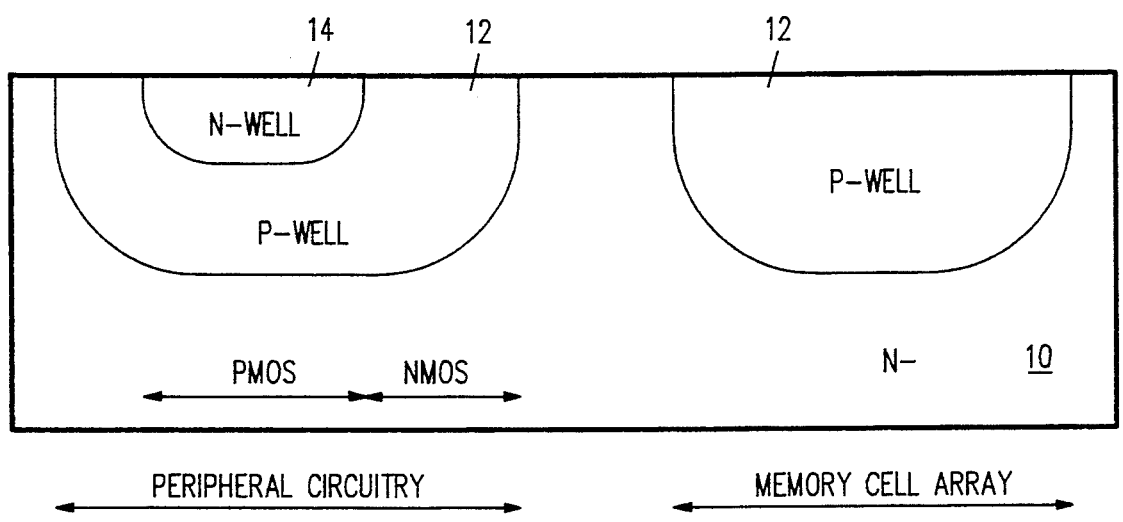
FIG. 4 is a cross-section drawing illustrating a triple-well structure utilizable in the fabrication of a high density EEPROM cell array.

Referring to FIG. 4, the fabrication process begins with a silicon substrate 10 of N-type conductivity. In a conventional front-end process step, an initial oxide layer (not shown) is grown over the substrate 10. A photoresist mask is then formed over the initial oxide layer and patterned to define selected surface areas of the N-type substrate 10. The exposed surface areas are then implanted with a P-type dopant to form P-well regions 12 in the substrate 10. The photoresist mask is then stripped from the surface of the oxide and a thermal drive-in step is performed to further define the P-well regions 12.

The initial oxide layer is then removed from the substrate 10 and a second oxide layer (not shown) is grown over the substrate 12. The substrate 12 is again masked with photoresist, which is patterned to define substrate surface areas within those P-well regions 12 which will ultimately contain the PMOS peripheral circuitry for the EEPROM memory cell array. N-type dopant is implanted into the periphery P-wells 12 to define N-well regions 14. The photoresist is then stripped and a further drive-in step for both the N-well regions 14 and the P-well regions 12 is performed. Following the drive-in step, the second oxide layer is removed, resulting in the structure shown in FIG. 4.

Thus, the initial processing steps result in the formation of a triple-well structure which defines the substrate 10 for the formation of the EEPROM memory cell array and its peripheral circuitry. The N-well regions 14 in the periphery will be utilized for the fabrication of PMOS devices. The P-well regions 12 in the periphery will be utilized for the formation of NMOS devices for the peripheral circuitry. The P-well regions 12 in the memory cell array portion of the substrate 10 will be utilized for formation of EEPROM storage cell devices.

Figure 5:
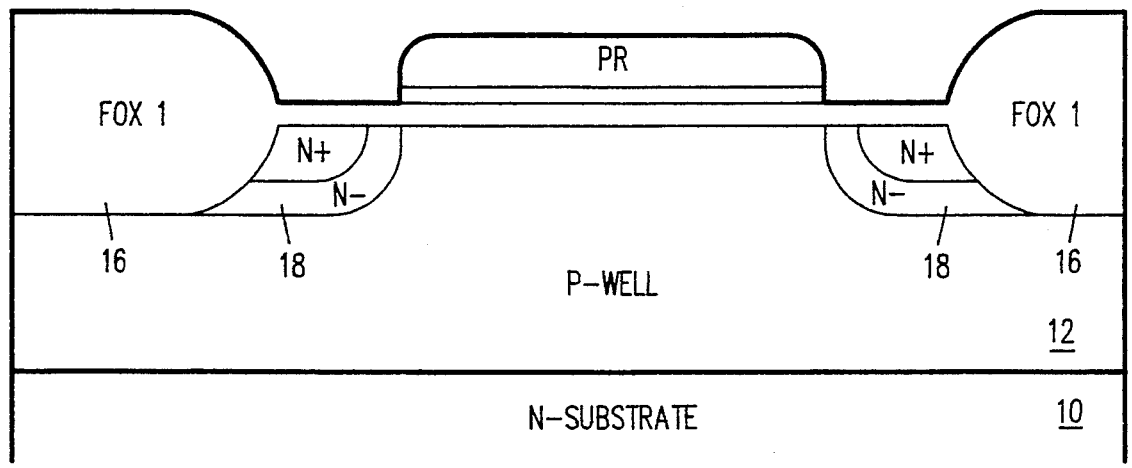
FIGS. 5-7 are cross-section drawings illustrating the fabrication of a high density EEPROM cell.

Referring now to FIG. 5, after formation of the triple-well structure described above, conventional process techniques are utilized to define regions in the substrate 10 for formation of field oxide. That is, a pad oxide is first grown on the surface of the substrate 10, followed by deposition of an overlying nitride layer. The pad oxide/nitride composite is masked with photoresist, which is then patterned to expose regions of underlying nitride which will ultimately define first field oxide (FOX1) regions. The nitride is then etched, the photoresist is stripped, a P-type field implant mask is formed, and a P-type field implant is performed through the exposed pad oxide regions. The field implant mask is then stripped and first field oxide regions (FOX1) 16 are formed, as shown in FIG. 5.

Next, as further shown in FIG. 5, portions of the P-well regions 12 in the memory cell array are masked, the nitride/oxide composite is etched, and an arsenic implant is performed to define N+ buried bit lines 18 adjacent to the FOX1 field oxide regions 16. Optionally, the arsenic implant can be followed by a phosphorous implant to form graded N+/N− bit lines, thereby optimizing resistance to avalanche breakdown during the erase of the EEPROM cells.

Figure 6:
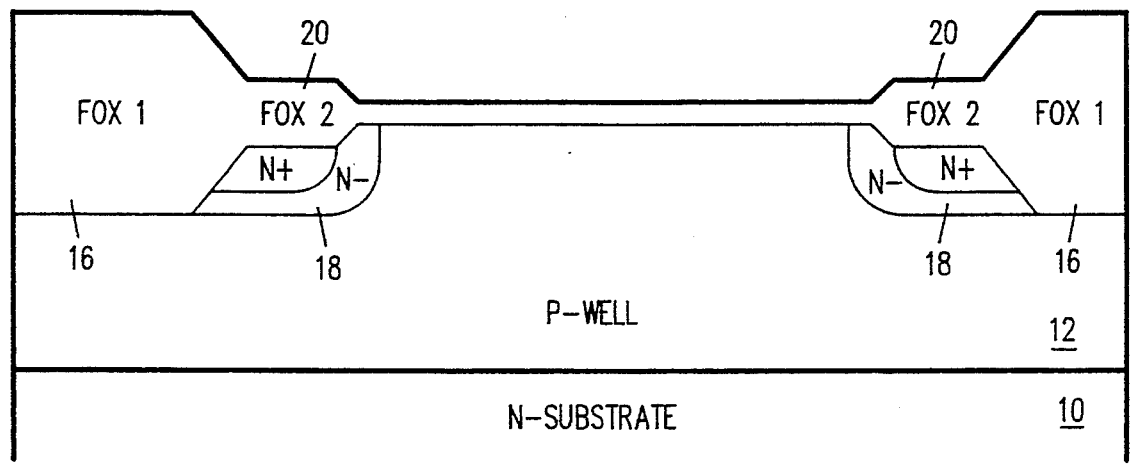

As shown in FIG. 6, the photoresist is then stripped and field oxide growth is completed by formation of second field oxide regions (FOX2) 20 over the N+/N− bit lines 18. Since the bit lines 18 are formed under the field oxide, the size of the device active region can be reduced, resulting in a reduced overall array size.

After completion of the field oxide growth, i.e. formation of FOX1 regions 16 and FOX2 regions 20, the oxide/nitride/oxide (ONO) layer is removed and a sacrificial oxide layer (not shown) is formed. A threshold voltage mask is then formed and patterned to expose the channel regions of the P-channel devices of the array. A threshold implant is then performed to characterize the threshold voltage of the storage cell transistors and the photoresist mask is stripped. Then the sacrificial oxide is removed.

Next, a gate oxide layer 22 about 300–500 Å thick is grown over the exposed portions of P-well region 12. A tunnel mask is then formed over the gate oxide 22 and patterned to define a tunnel window over the P-well 12. The tunnel window is then etched through to the surface of the underlying P-well 12. The tunnel mask is then stripped and tunnel oxide 24 about 80–100 Å thick is grown in the tunnel window. Next, a first layer 26 of polysilicon is deposited on the underlying oxide to a thickness of about 1500 Å and doped with phosphorous in a conventional manner. The polysilicon (poly1) will serve as the floating gate for the EEPROM cells of the array. A composite dielectric layer 28 of oxide/nitride/oxide (ONO) is then formed on the poly1. After growing this ONO layer 28, a photoresist mask is used to define strips on the ONO. The ONO/poly1 composite is then plasma etched to form parallel lines of ONO/poly1.

After stripping the photoresist from the poly1 mask, a thin edge oxide is grown on the sidewalls of the poly1 lines to provide insulation from subsequently-formed control gate conductive material.

Next, a protect array mask is formed over the memory cell array portion of the substrate 10 and device formation in the periphery proceeds.

First, oxide is etched from the substrate active device regions in the periphery and gate oxide is grown on the active device regions. A threshold mask is then formed and a P-type implant is performed to set the threshold of the peripheral MOS devices. The threshold photoresist mask is then stripped and processing begins to form both the word lines for the memory cell array and the gates for the MOS devices in the periphery.

That is, a second layer of polysilicon (poly2) is deposited over the surface of the entire device and doped in the conventional manner. This is followed by deposition of an overlying layer of tungsten silicide. The poly2/tungsten silicide composite is then masked and etched to define the word lines 30 in the storage cell array and the gate electrodes of the peripheral MOS devices, the word lines 30 running perpendicular to and overlying the ONO/poly1 lines in the array. The poly2 mask is then UV-hardened and a self-aligned etch (SAE) mask is formed. This is followed by a stacked etch of the poly1 floating gates 26 utilizing the overlying poly2 word lines 30 as a mask for the self-aligned etch of the ONO/poly1 composite.

The remaining photoresist is then stripped from the device and a sidewall seal oxidation step is performed on the devices in the peripheral region and for the poly1/poly2 stack in the array. From this point, the process flow proceeds according to standard CMOS process techniques. The resulting cell structure is shown in FIG. 7.

Figure 7:
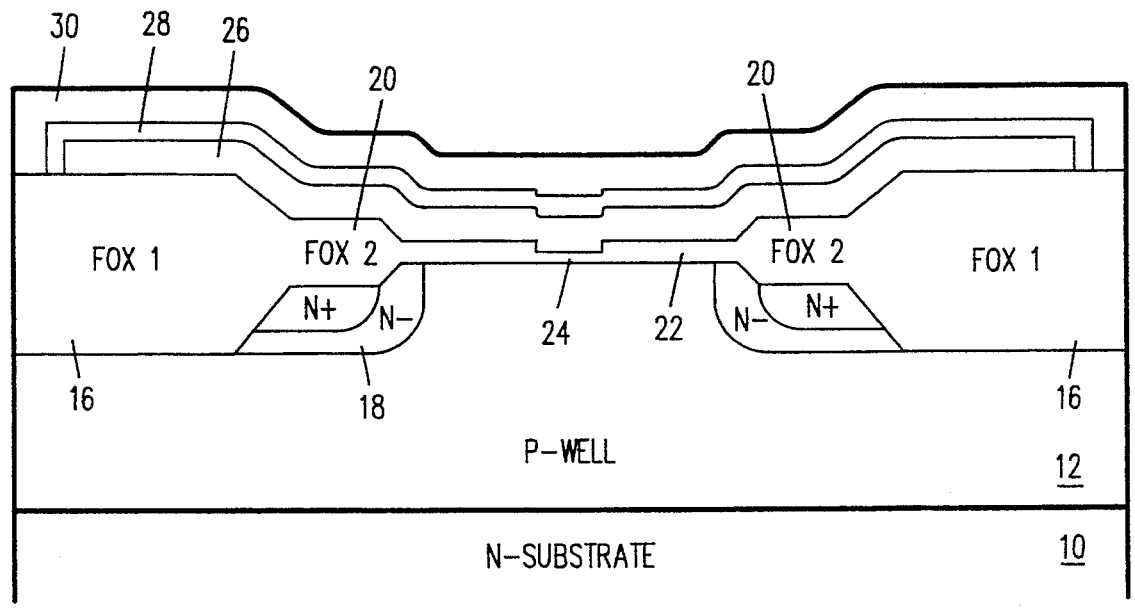
Figure 8:
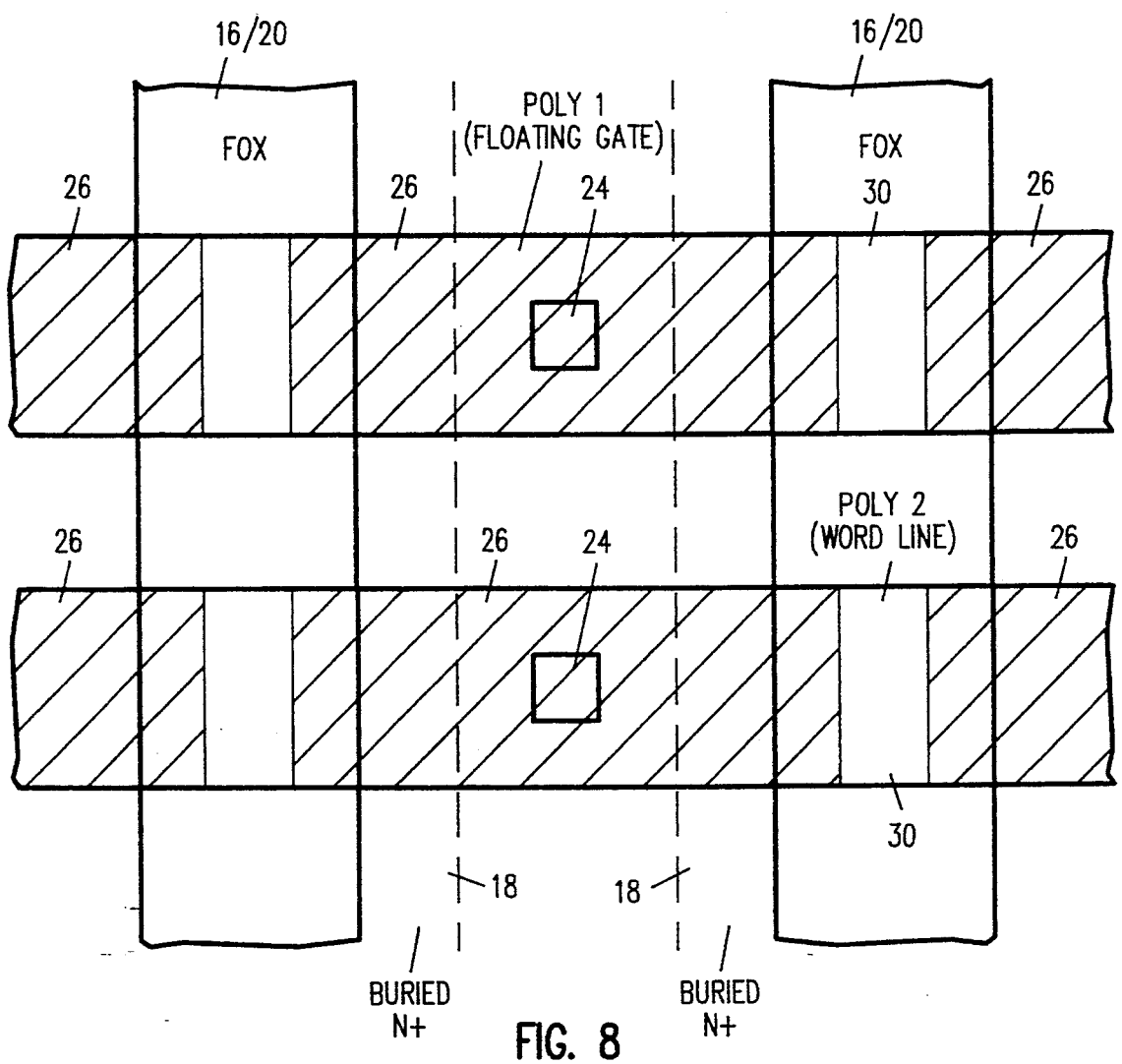
FIG. 8 is a layout illustrating the FIG. 7 cell structure.

A corresponding layout of the FIG. 7 cell is shown in FIG. 8, with the FIG. 7 cross section being taken along a word line 30 in the FIG. 8 layout.

Figure 9:
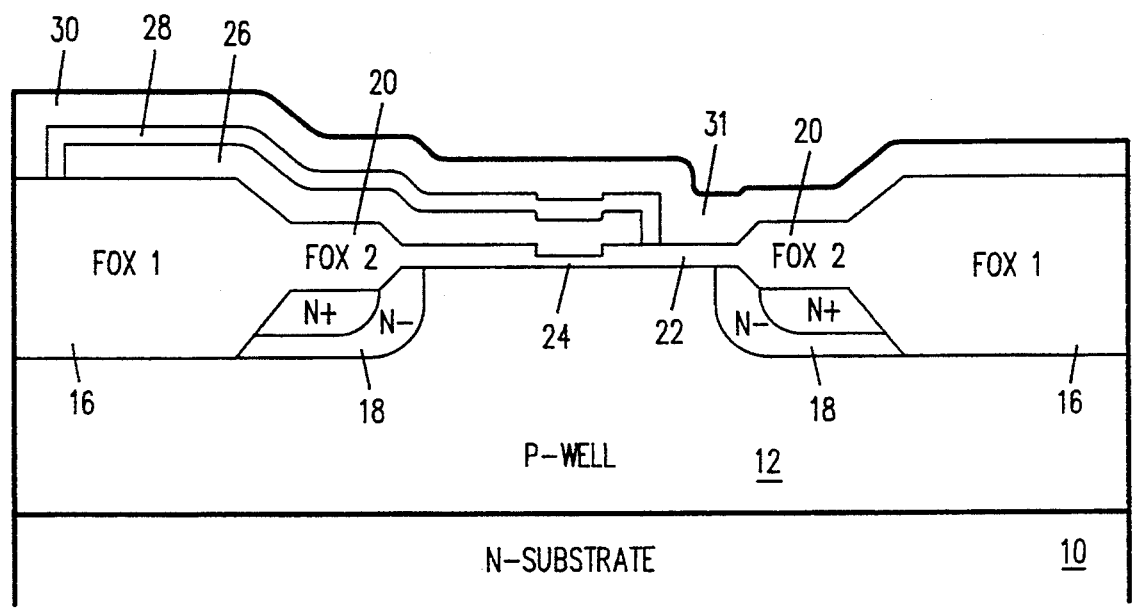
FIG. 9 is a cross-section drawing illustrating a second alternative embodiment of a high density EEPROM cell.

FIG. 9 illustrates a cross section of an alternative embodiment of a EEPROM memory cell in accordance with the parent application wherein the poly1 floating gate 26 is truncated over the P-well region 12 between N+ buried bit lines 18. Thus, the overlying poly2 word line 30 forms the gate 31 of an internal access transistor in a manner similar to the Shelton cell described above. However, because of the advantages provided by the processing techniques described above, the FIG. 9 cell is smaller than the Shelton cell and utilizes a poly2 access gate rather than an aluminum gate.

Figure 10:
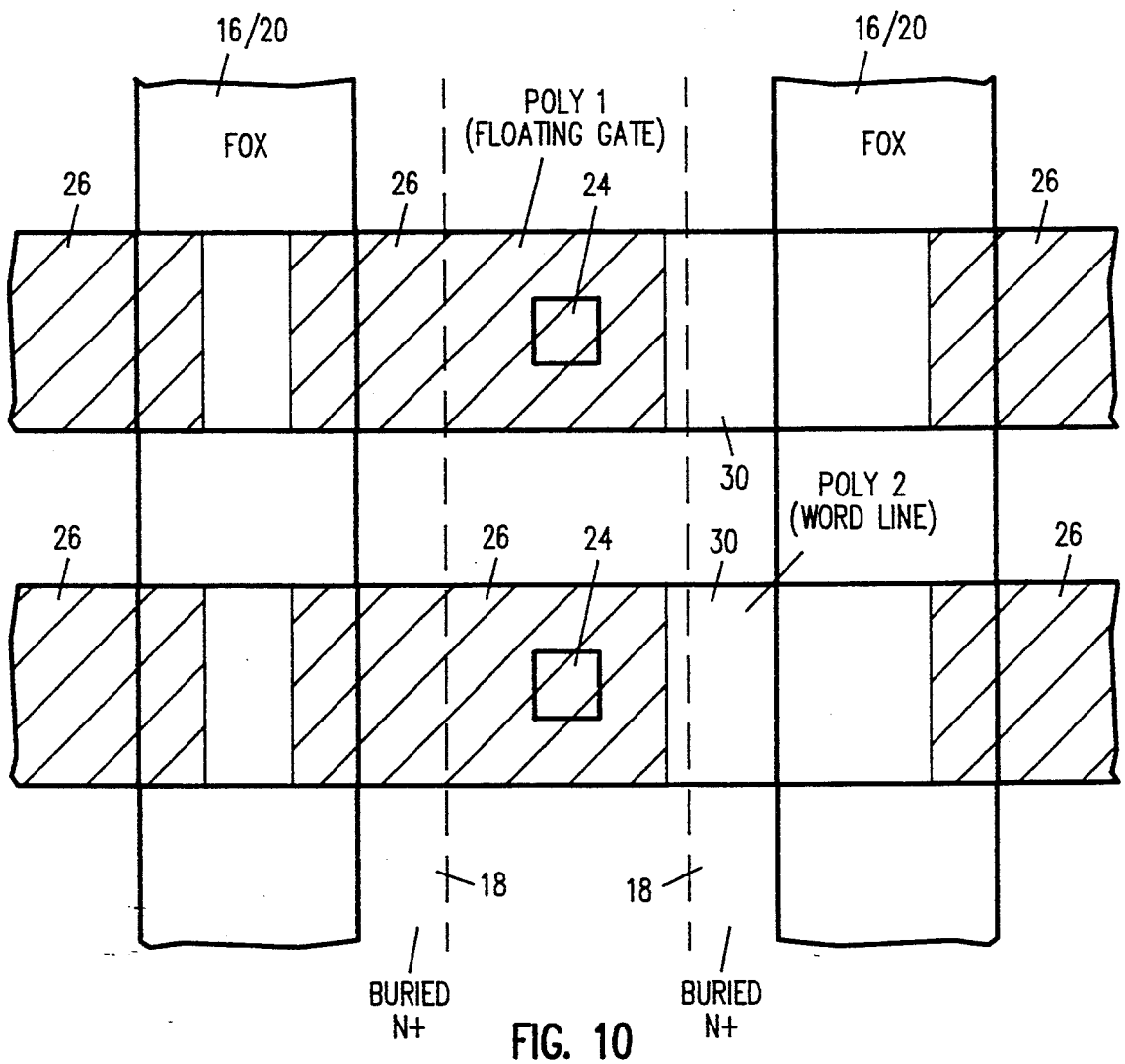
FIG. 10 is a layout illustrating the FIG. 14 cell structure.

A layout of the cell shown in FIG. 9 is provided in FIG. 10, the FIG. 9 cross-section being taken along a word line 30 in the FIG. 10 layout.

Although the cell shown in FIGS. 7 and 8 eliminates the access transistor typically utilized in EEPROM cells, it is, thus, susceptible to over-erase, resulting in read disturb problems. Therefore, the FIG. 7/8 embodiment may require a special erase algorithm to prevent over-erase. For example, the erase operation could be allowed to proceed for some specified time period, e.g. 10 μsec, after which the threshold voltage $V_T$ of each cell in the array is read. If the threshold voltage $V_T$ of any cell in the array is less a specified value, e.g. 1.2 V, then the erase procedure is terminated. If the threshold voltage of all cells remains above 1.2 V, then another timed erase iteration is performed.

As stated above, the FIG. 9/10 embodiment includes a select transistor to address the over-erase problem, but requires greater overall cell area to do so.

In both embodiments of the parent application, the resulting array relies on a novel compact cell that does not require a separate access transistor. Furthermore, as stated above, in both embodiments, the buried N+ regions do not define the storage transistor channel which, rather, is self-aligned with the field oxide, particularly the FOX2 second field oxide region 20, thereby further reducing cell size.

Figure 11:
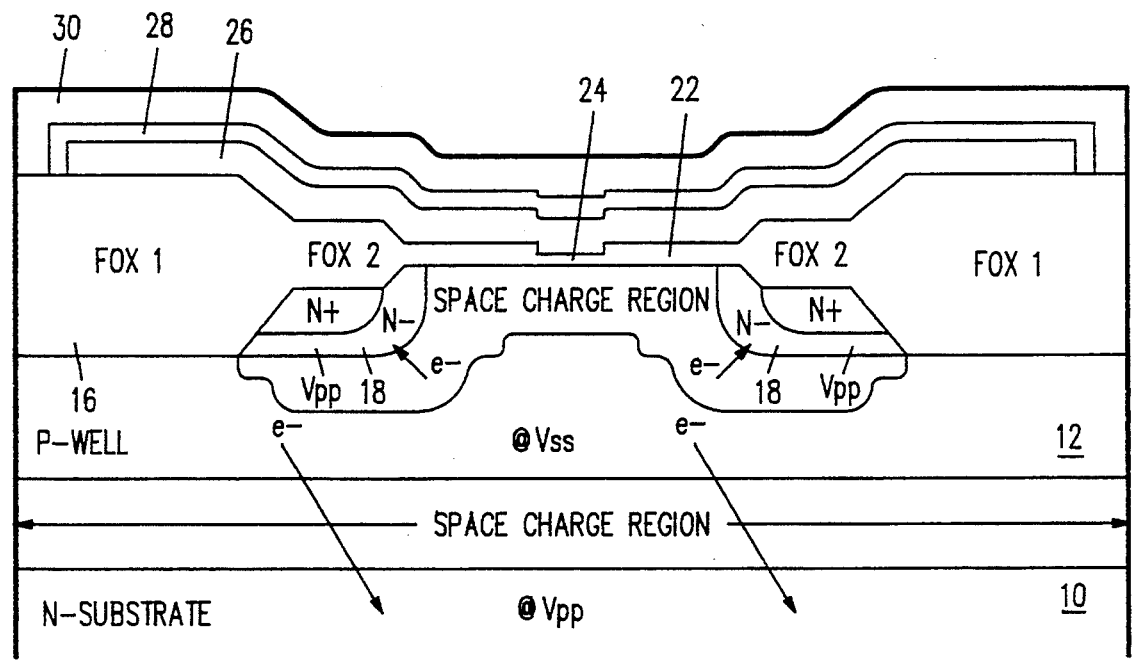
FIG. 11 is a cross-section drawing illustrating program inhibit conditions in the cells during programming.

Table 1 provides a novel programming scheme for both the FIG. 7/8 and FIG. 9/10 embodiments of the parent application. In accordance with another aspect of the parent application, and as shown in FIG. 11, the Table 1 program inhibit scheme addresses deep depletion during programming by causing any minority carriers (i.e. electrons) thermally generated in the P-well 12 or in the space charge regions to be "sucked up" by the N-/P- well and N+ bit line/P-well reversed bias junctions.

More specifically, with reference to FIG. 12, the programming conditions are as follows. To program cell A, word line WL1 is held at the programming voltage $V_{pp}$. Bit line $BL_n$ and bit line $BL_{n'}$, are held at the low supply voltage $V_{ss}$. The P-well is also held at $V_{ss}$. This creates an inversion layer of minority carriers in the channel, causing electrons to tunnel to the floating gate.

TABLE 1

|  | Source | Drain | Control Gate | P-Well | N-Sub |
|---|---|---|---|---|---|
| Write | Vss | Vss | Vpp | Vss | Vpp |
| WL Write Inhibit | Vpp | Vpp | Vpp | Vss | Vpp |
| BL Write Inhibit | Vss | Vss | Vss | Vss | Vpp |
| Erase | Vpp | Vpp | Vss | Vpp | Vpp |
| BL Erase Inhibit | Vpp | Vpp | Vpp | Vpp | Vpp |
| Read | Vss | Vread | Vcc | Vss | Vcc |

During this operation, cell C is program-inhibited by holding word line WL2 at $V_{ss}$, bit line $BL_n$ and $BL_{n'}$ at $V_{ss}$ and the P-well at $V_{ss}$. Furthermore, cell B is program inhibited by holding word line WL1 at $V_{pp}$ and raising bit line $BL_{n+1}$ and $BL_{n'+1}$ to the programming voltage, while the P-well is held at $V_{ss}$. This avoids the occurrence of any minority carriers at the P-well surface under the floating gate; the only minority carrier generation is thermal and all of these electrons are evacuated from the P-well 12 by the bit line/P-well and N-/P-well reverse bias junctions.

Figure 12:
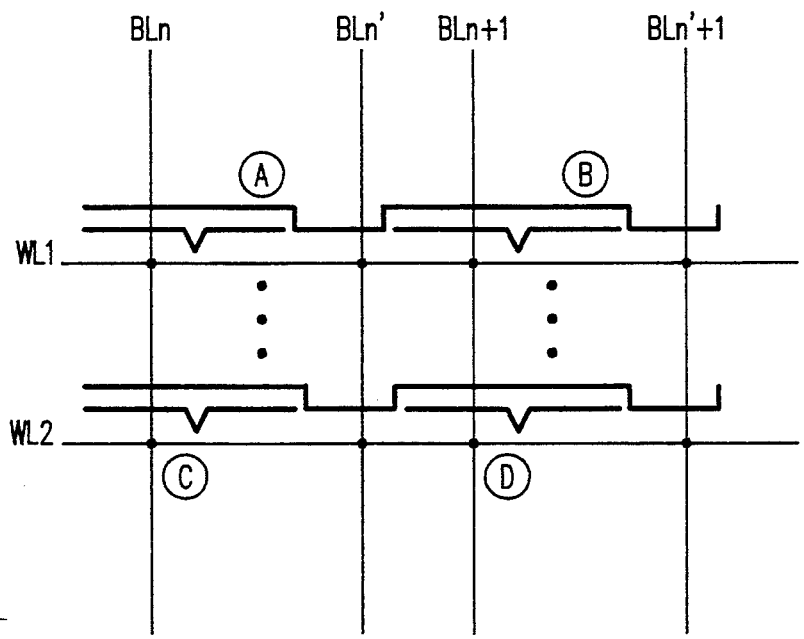
FIG. 12 is a schematic diagram illustrating a portion of a high density EEPROM cell array.

With continuing reference to FIG. 12, in accordance with another aspect of the co-pending application, the erase conditions for the above-described cell are as follows. To erase cell A and its associated byte or word line, word line WL1 is held at $V_{ss}$ while bit lines $BL_n$ and $BL_{n'}$ and $BL_{n+1}$ and $BL_{n'+1}$, as well as the P-well, are held at the programing voltage Vpp. During this operation, cell C is erase inhibited by holding word line WL2 at the programming voltage.

As shown in Table 1, cell A of FIG. 12 is read by first setting the source bit line, such as bit line $BL_n$, to the low supply voltage $V_{ss}$, while the drain bit line, such as bit line $BL_{n'}$ is set to the read voltage $V_{read}$. Next, word line WL1 is set to the intermediate voltage Vcc. As is well known, once the bit line and word line voltages are established, the logical state of cell A is then determined by sense amplifiers which generate a representative voltage based on the current flow through the cell.

In operation, the voltage on the drain bit line attains the read voltage $V_{read}$ a precharge time $T_1$ after the read voltage $V_{read}$ is applied due to the capacitance associated with each memory cell that is connected to the drain bit line. Further, the logical state of cell A is determined a sense time $T_2$ after the voltages on the bit lines and word line are established due to the time required by the sense amplifiers to generate the representative voltage of cell A. Thus, the read access time of cell A is defined by the sum of the precharge time $T_1$ and the sense time $T_2$.

The precharge time $T_1$ can be defined by the following equation:

$$T_1 = \frac{(C)(V_1)(B)}{(I_1)} \qquad \text{EQ. 1}$$

where $T_1$ represents the time required to precharge a bit line, C represents the capacitance associated with each memory cell, $V_1$ represents the read voltage, B represents the number of cells connected to the bit line, and $I_1$ represents the bit line current during precharge.

For example, if the capacitance associated with each cell is 3 fF, the read voltage $V_{read}$ is 2 volts, and the bit line current is 200 µA, then the time $T_1$ required to precharge a buried bit line which has 1024 cells connected to it is 30.72 ns.

Similarly, the sense time $T_2$ can be defined by the following equation:

$$T_2 = \frac{(C)(V_2)(B)}{(I_2)} \qquad \text{EQ. 2}$$

where $T_2$ represents the time required to read the selected memory cell, C represents, as above, the capacitance associated with each memory cell, $V_2$ represents the voltage swing of the sense amplifiers, B represents, as above, the number of cells connected to the bit line, and $I_2$ represents the bit line read current.

For example, if the capacitance associated with each cell is 3 fF, the voltage swing is 100 mV, the bit line read current is 50 µA, and the number of cells connected to the bit line is 1024, then the time $T_2$ required to read the selected memory cell is 6.144 ns.

As stated above, read access times can be a significant factor in the selection of an EEPROM device. Thus, as described in greater detail below, the present invention significantly reduces both the precharge time $T_1$ and the sense time $T_2$, and thereby the read access time, by utilizing segment select circuitry to divide the EEPROM array described in the co-pending application into a series of segments which can be individually accessed.

Figure 13:
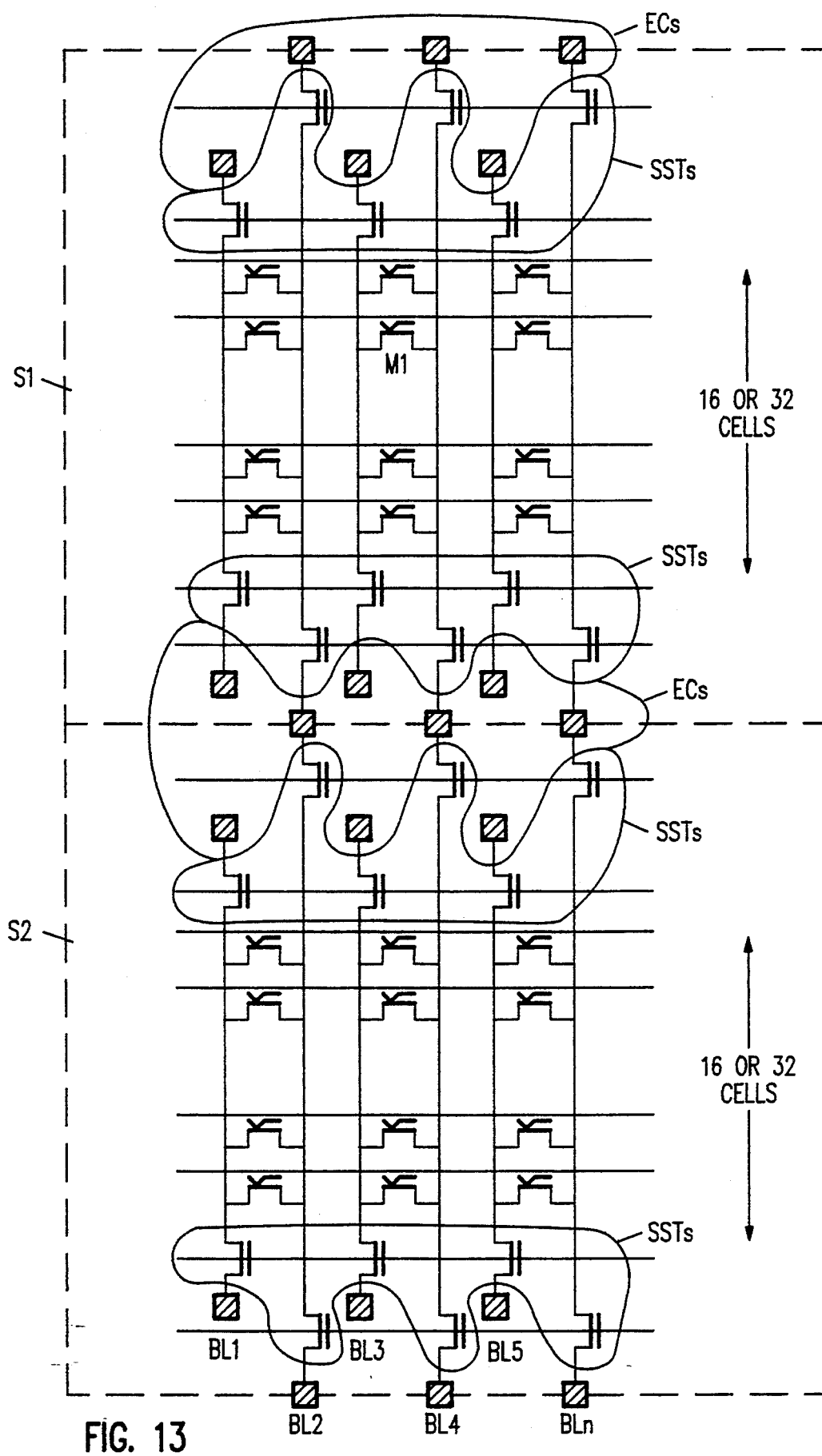
FIG. 13 is a plan view illustrating a portion of an EEPROM array in accordance with the present invention.

FIG. 13 shows a plan view that illustrates a portion of an EEPROM array in accordance with the present invention. As shown in FIG. 13, the memory array includes a series of N+ buried bit lines BL1–BLn, each of which are preferably contacted after every 16 or 32 memory cells with an external contact EC. As further shown in FIG. 13, the memory array is divided into two segments S1 and S2 along a line formed by the external contacts ECs. Each buried bit line BL is then isolated into segments by interrupting each N+ buried bit line BL with a segment select transistor SST.

A specific memory cell or cells in one of the segments S1 and S2 can then be accessed by turning on the segment select transistors which correspond to the segment which contains the specific memory cell or cells. For example, if only a memory cell M1 in segment S1 is to be accessed, then only the segment select transistors SSTs in segment S1 would be turned on while the remaining segment select transistors would be turned off.

By reducing the number of memory cells which are effectively connected to each N+ buried bit line, represented as "B" in EQ. 1, the precharge time $T_1$ and the sense time $T_2$ can be significantly reduced. For example, using EQ. 1, by reducing B from 1024 memory cells to 32 memory cells, the precharge time $T_1$ can be reduced from 30.72 nS, as stated above, to 0.96 nS. In addition, the sense time $T_2$, as defined by EQ. 2, can be reduced from 6.144 nS to 0.192 nS.

The process of the present invention begins by forming the triple well structure. As described above, the triple well structure includes a P-well region of P-type conductivity that has been formed by implanting a P-type dopant into an N-type semiconductor material.

Figure 14:
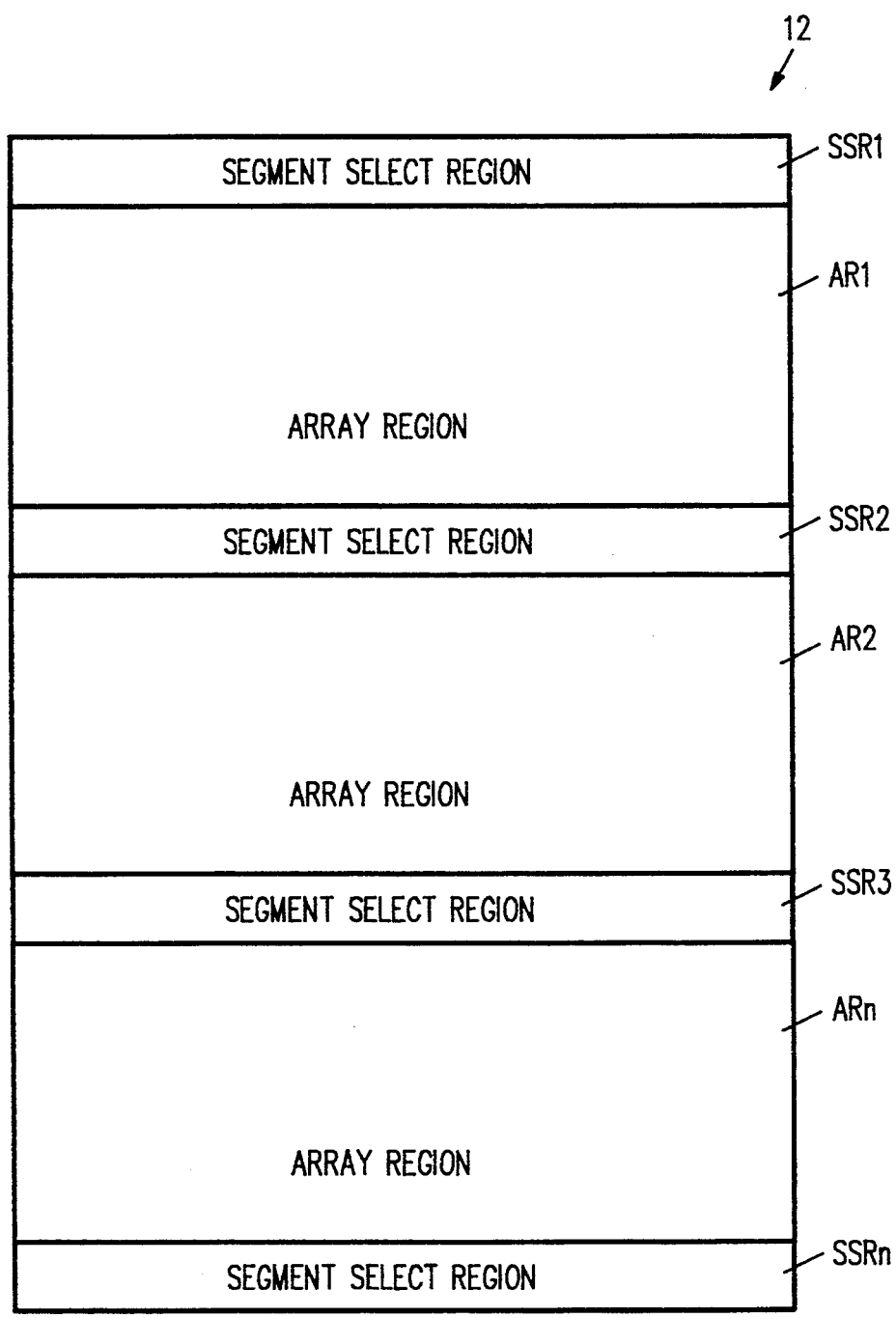
FIG. 14 is a plan view illustrating a P-well region 12 in accordance with the present invention.

FIG. 14 shows a plan view that illustrates a P-well region 12 in accordance with the present invention. As shown in FIG. 14, P-well region 12 includes a series of adjacent segment select regions SSR1–SSRn and a series of adjacent array regions AR1–ARn which are arranged so that one array region AR is located between and adjoins each pair of adjacent segment select regions SSRs.

After the triple well structure has been formed, a series of strips of first field oxide are formed on the semiconductor material in P-well 12 so that a portion of each strip is formed in each segment select region SSR and each array region AR. The series of strips of first field oxide are first formed by growing a layer of pad oxide over the semiconductor material, followed by the deposition of an overlying layer of nitride. A field oxide mask is then formed over the nitride/pad oxide composite and patterned to define the series of strips of first field oxide.

Next, the unmasked areas are etched until the underlying pad oxide material is exposed. Following this, the field oxide mask is stripped and a field implant mask is formed and patterned. A P-type field implant is then performed through the pad oxide. After the field implant has been completed, the field implant mask is stripped and the series of strips of field oxide FOX1 are formed by oxidizing the exposed layer of pad oxide.

Figure 15:
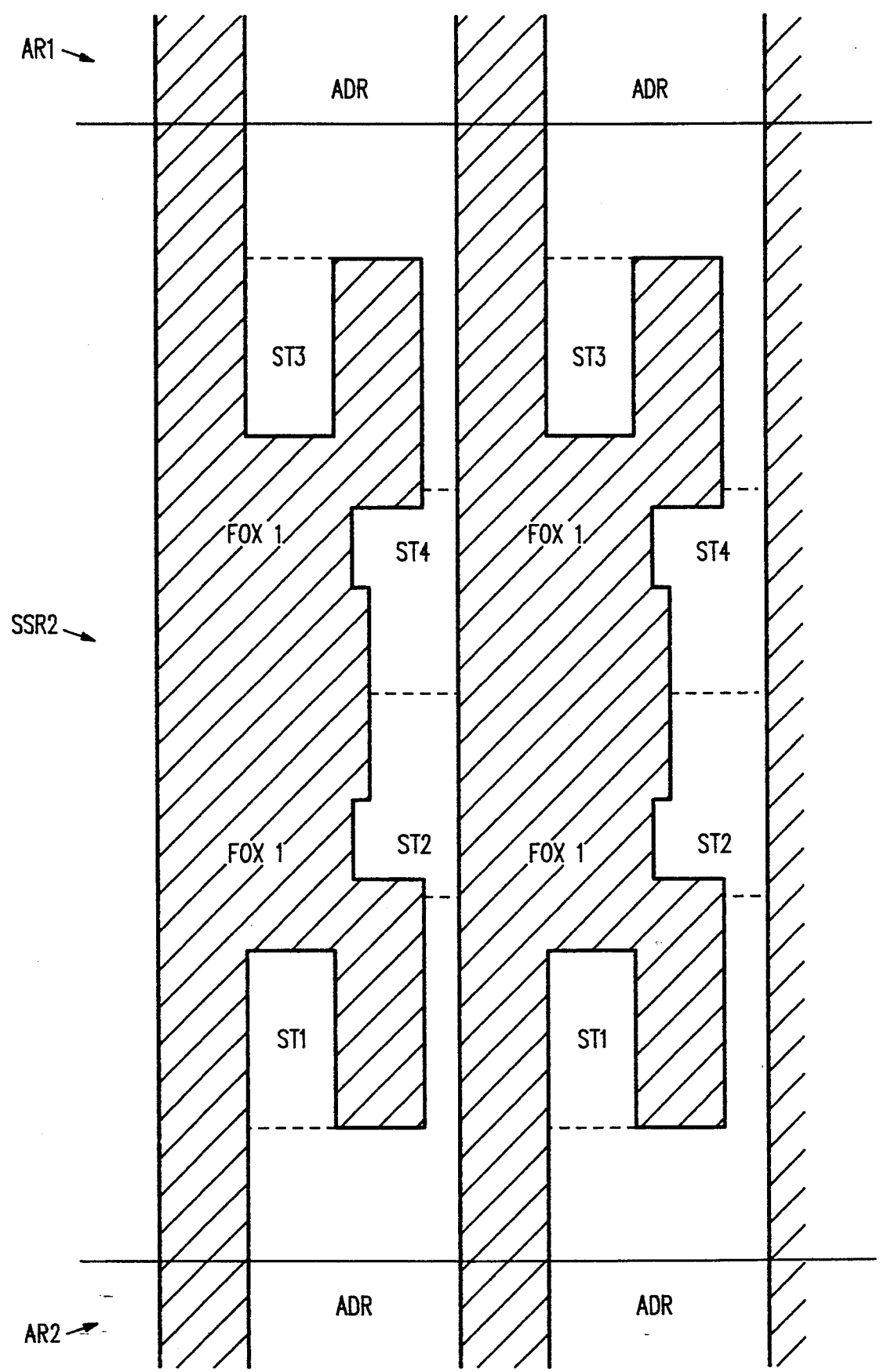
FIG. 15 is a plan view of a portion of array region AR1, segment-select region SSR2, and array region AR2 illustrating the formation of the series of strips of first field oxide FOX1 in P-well 12.

FIG. 15 shows a plan view of a portion of array region AR1, segment select region SSR2, and array region AR2 that illustrates the formation of the series of strips of first field oxide FOX1 in P-well 12. As shown in FIG. 15, each strip of first field oxide FOX1 in segment select region SSR2 defines two segment select transistor regions ST1/ST2 that correspond to array region AR2, and two segment select transistor regions ST3/ST4 that correspond to array region AR1. In addition, each pair of adjacent strips of first field oxide FOX1 in each array region AR defines a P-type active device region ADR therebetween.

After the series of strips of first field oxide FOX1 have been formed, a series of N+ buried bit lines are formed in the P-type semiconductor material so that a portion of each buried bit line is formed in each pair of adjacent segment select regions SSRs and the adjoining array region AR located therebetween.

The series of N+ buried bit lines are initially formed by forming a bit line mask over the series of strips of first field oxide FOX1 and the nitride/pad oxide composite structure formed therebetween, and then patterning the bit line mask to define the series of buried bit lines. Next, the layer of nitride is etched until the layer of pad oxide is exposed. An arsenic implant is then performed through the layer of pad oxide to define the N+ buried bit lines. Following this, the bit line mask is removed.

Optionally, as stated above, the arsenic implant can be followed by a phosphorous implant to form graded N+/N− bit lines, thereby optimizing resistance to avalanche breakdown during the erase of the EEPROM cells.

Figure 16:
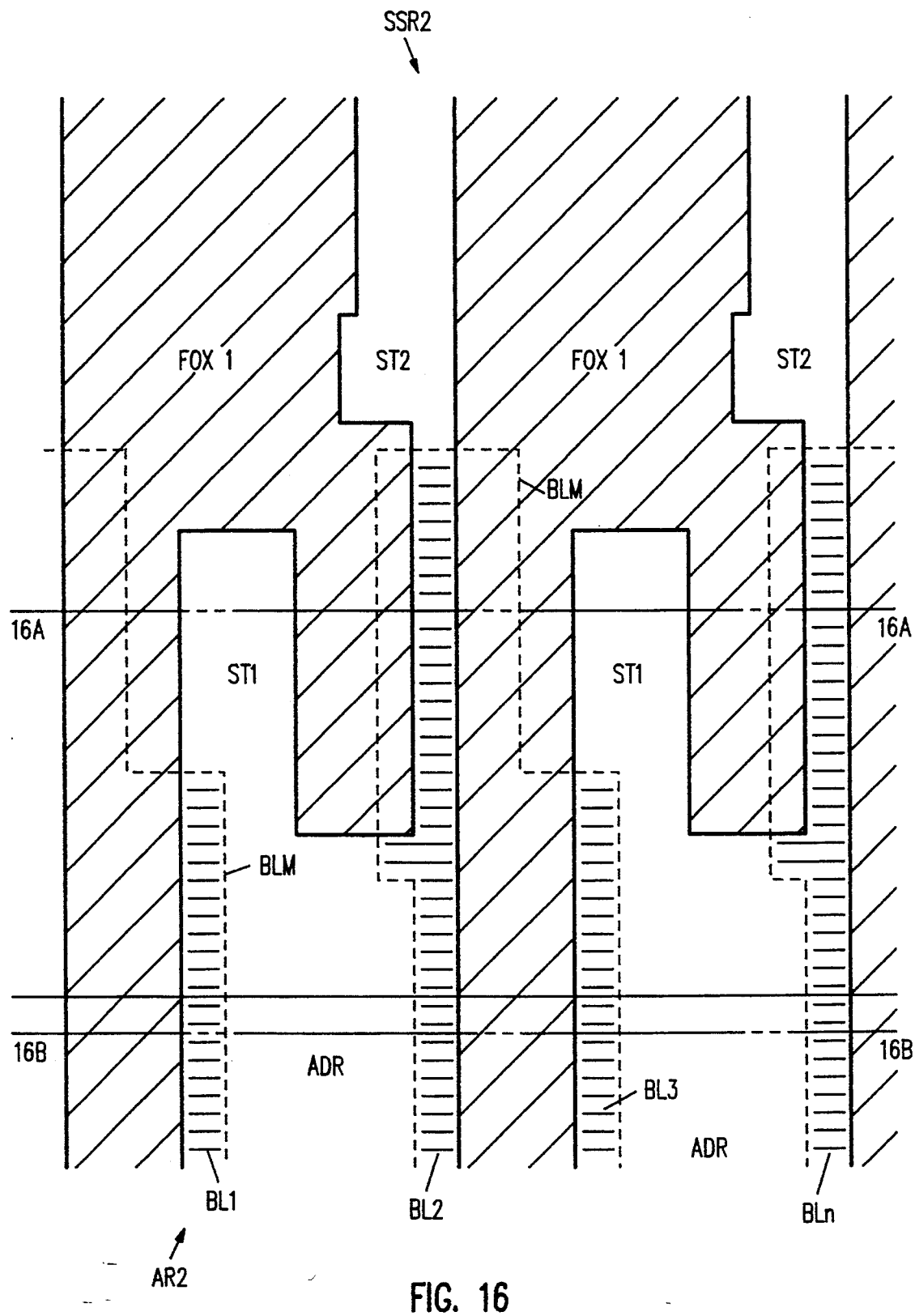
FIG. 16 is a plan of a portion of segment select region SSR2 and a portion of array region AR2 illustrating the formation of a bit line mask BLM and a series of N+ buried bit lines BL1-BLn in P-well 12.

FIG. 16 shows a plan view of a portion of segment select region SSR2 and a portion of array region AR2 that illustrates the formation of a bit line mask BLM and a series of N+ buried bit lines BL1–BLn in P-well 12. Both the bit line mask BLM and the layer of first field oxide FOX1 prevent the arsenic implant from penetrating through to the substrate below. Thus, as shown in FIG. 16, the bit line mask BLM can be formed to overlap portions of the strips of first field oxide FOX1.

As further shown in FIG. 16, the portion of each buried bit line BL in array region AR2 is formed in the active device region ADR adjacent to one strip of field oxide FOX1, while the portion of each buried bit line BL in segment select region SSR2 is formed to adjoin one of the segment select transistor regions ST1 and ST2.

Once the series of buried bit lines BL1–BLn have been formed, the resulting structure is again oxidized. Since very little oxidation will take place over the existing layer of nitride, and since the rate of oxidation over the buried bit lines will be significantly greater than any further oxidation over the layer of first field oxide FOX1, a layer of second field oxide FOX2 is primarily formed on the semiconductor material over each of the buried bit lines. Since the bit lines BLs are formed under the layer of second field oxide FOX2, the size of the active device region is reduced, thereby resulting in a reduced overall array size.

Figure 17:
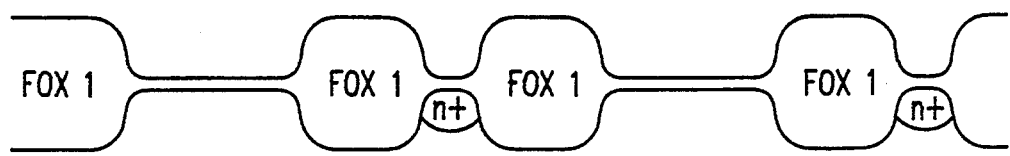
FIGS. 17-18 are cross-sectional diagrams taken along lines 16A—16A and 16B—16B, respectively, illustrating the resulting structure following the growth of the layer of second field oxide FOX2.
Figure 18:
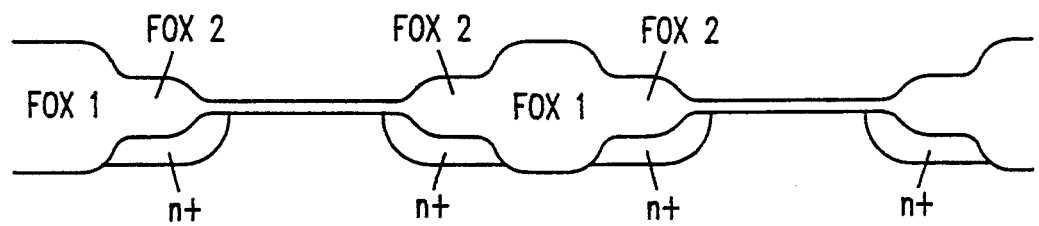

FIGS. 17 and 18 show cross-sectional diagrams taken along lines 16A—16A and 16B—16B, respectively, that illustrate the resulting structure following the After the layer of second field oxide FOX2 has been formed, the next step is to set the channel threshold voltages for each of the to be formed memory cells. The threshold voltages are first set by removing the nitride/pad oxide composite layer. Next, a layer of sacrificial oxide is grown on the exposed semiconductor material of P-well 12, followed by the formation of a threshold voltage mask.

Next, the threshold voltage mask is patterned to define the channel regions of the to be formed memory cells. A threshold implant is then performed through the unmasked layer of sacrificial oxide to characterize the threshold voltages of the storage cell transistors. Following this, the threshold voltage mask is stripped and the layer of sacrificial oxide is removed.

Following the threshold implant, a layer of first gate oxide GATE OXIDE 1 approximately 300–500 Å thick is grown on the semiconductor material of P-well 12. A tunnel mask is then formed over the layer of first gate oxide GATE OXIDE 1 and patterned to define a tunnel window over P-well 12. The tunnel window is then etched through to the surface of the underlying P-well 12.

Figure 19:
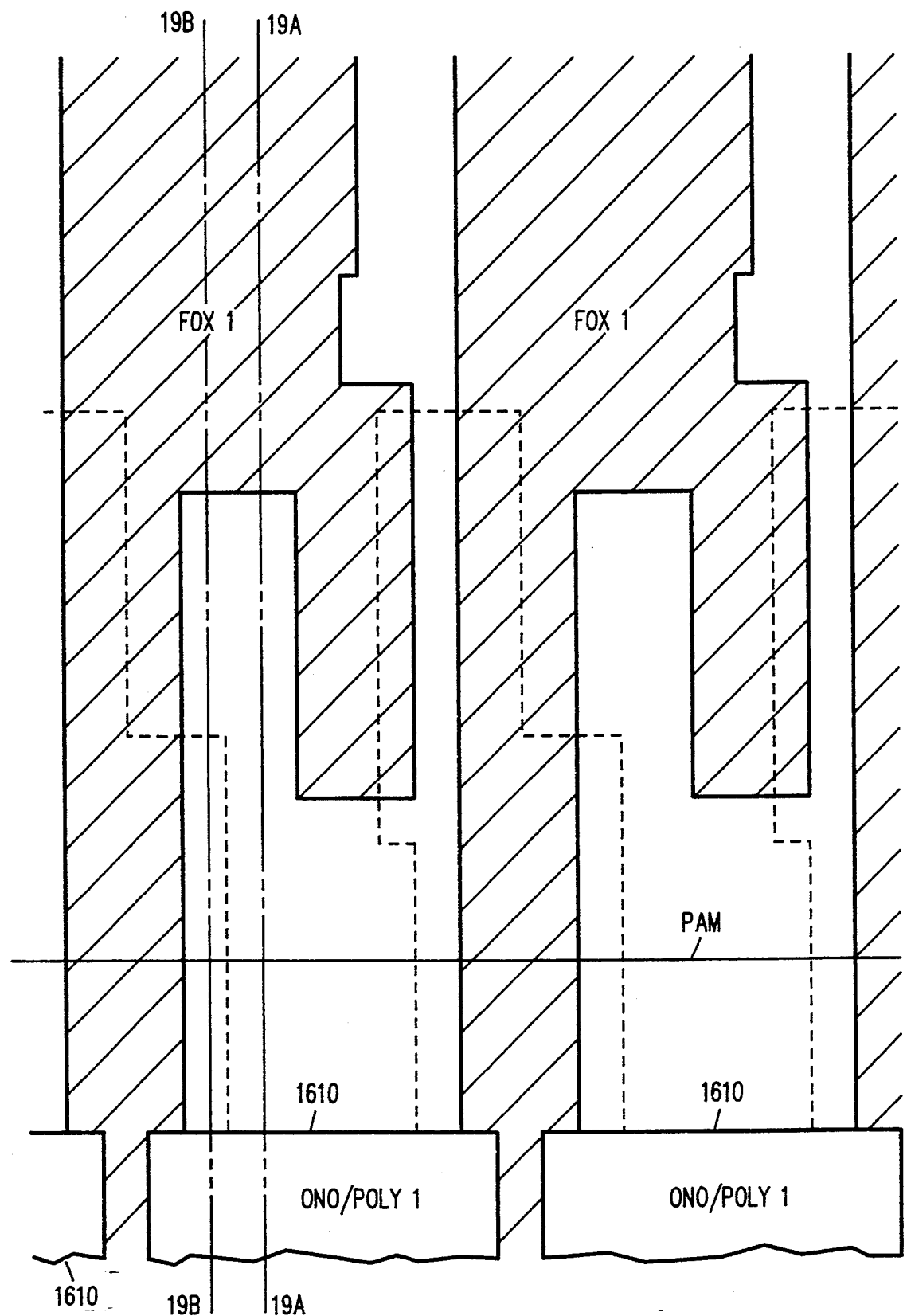
FIG. 19 is a plan view of a portion of segment select region SSR2 and a portion of array region AR2 illustrating a series of strips of ONO/poly 1 1610.

The tunnel mask is then stripped and tunnel oxide about 80–100 Å thick is grown in the tunnel window. Next, a first layer of polysilicon (poly1) is deposited on the underlying oxide to a thickness of about 1500 Å and doped in a conventional manner. The layer of poly1 will serve as the floating gate for the EEPROM cells of the array. A composite dielectric layer of oxide/nitride/oxide (ONO) is then formed on the layer of poly1. After forming the layer of ONO, a photoresist mask is used to define strips on the layer ONO. The ONO/poly1 composite is then plasma etched to form a series of parallel strips of ONO/poly1. FIG. 19 shows a plan view of a portion of segment select region SSR2 and a portion of array region AR2 that illustrates a series of strips of ONO/poly1 1610.

After the strips of ONO/poly1 1610 have been formed, the poly1 mask is removed and a thin layer of edge oxide (not shown) is grown on the sidewalls of the strips of ONO/poly1 1610 to provide insulation from the to be formed control gate. Next, a protect array mask PAM is formed over each of the array regions ARs so that device formation in the segment select regions SSRs and the periphery can proceed.

Figure 20:
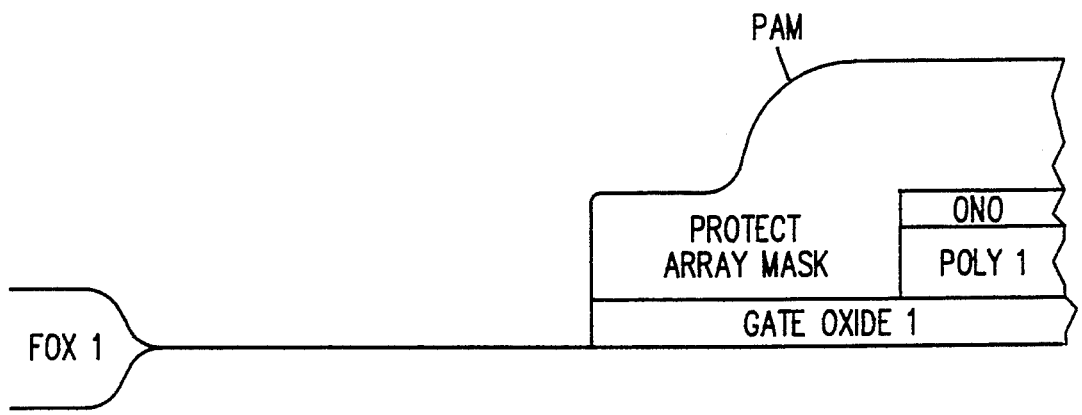
FIGS. 20 and 21 are cross sectional diagrams taken along lines 19A—19A and 19B—19B, respectively, of FIG. 19 illustrating the resulting structure following the removal of the layer of first gate oxide from segment select region SSR2.
Figure 21:
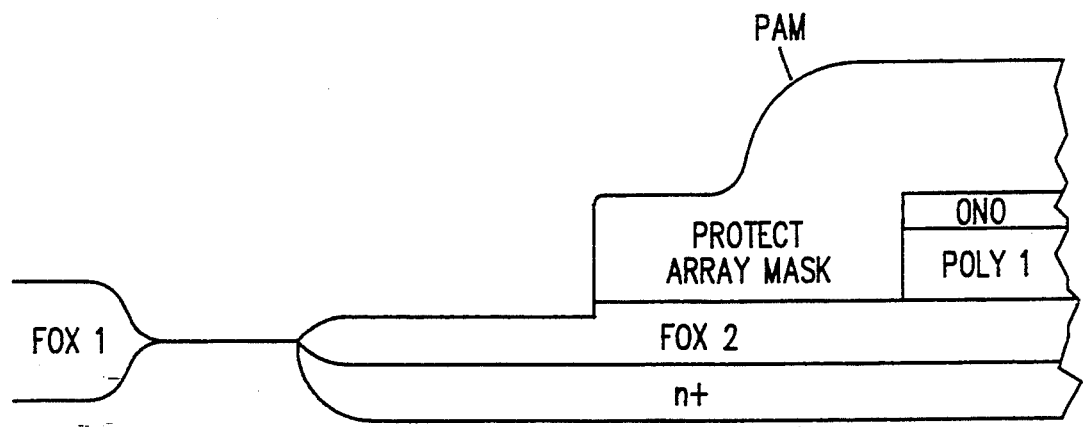

Following the formation of the protect array mask PAM, the layer of first gate oxide GATE OXIDE 1 is etched from the segment select regions SSRs and the periphery. FIGS. 20 and 21 show cross sectional diagrams taken along lines 19A—19A and 19B—19B, respectively, of FIG. 19 that illustrate the resulting structure following the removal of the layer of first gate oxide GATE OXIDE 1 from segment select region SSR2.

Once the layer of first gate oxide GATE OXIDE 1 has been removed, a layer of second gate oxide GATE OXIDE 2 is grown in the segment select regions SSRs and in the periphery. After the layer of second gate oxide GATE OXIDE 2 has been grown, the next step is to set the channel threshold voltages for each of the to be formed segment select transistors and the MOS devices in the periphery.

The threshold voltages are set by forming and patterning a threshold mask to define the channel regions, and then implanting a P-type dopant through the unmasked layer of second gate oxide GATE OXIDE 2. Following this, the threshold voltage mask and the protect array mask PAM is stripped.

Next, a layer of second polysilicon (poly2) is deposited over the surface of the entire device and doped in a conventional manner. This is followed by deposition of an overlying layer of tungsten silicide. A poly2 mask is then formed over the poly2/tungsten silicide composite and patterned to define a series of word lines in each array region AR, a series of segment select lines in each segment select region SSR, and the gate electrodes of the peripheral MOS devices.

Figure 22:
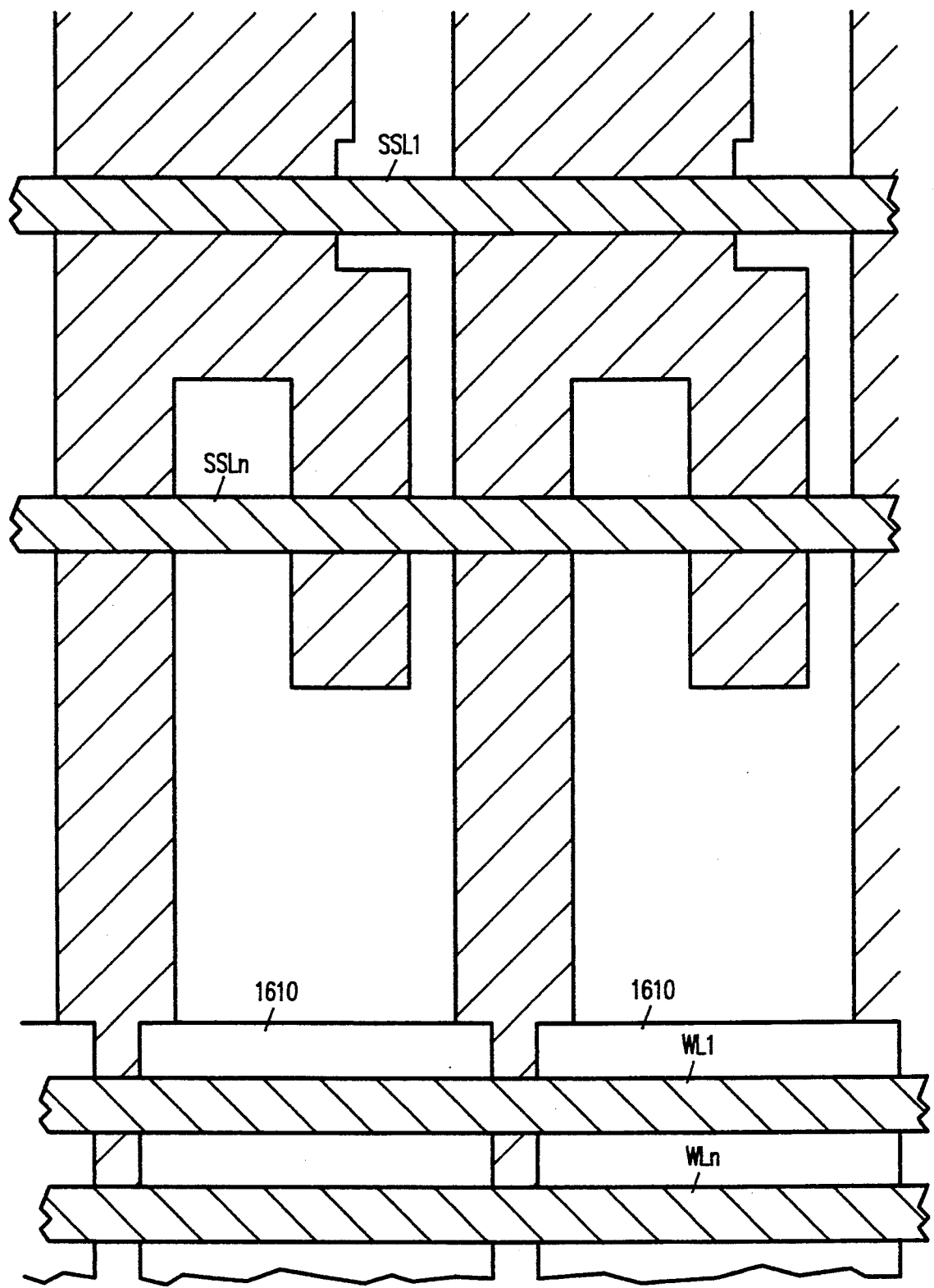
FIG. 22 is a plan view of a portion of segment select region SSR2 and a portion of array region AR2 illustrating the formation of a series of word lines WL1-WLn and a series of segment select lines SSL1-SSLn.

Following this, the poly2/tungsten silicide composite is etched until the unmasked layers of poly2 and tungsten silicide have been removed. FIG. 22 shows a plan view of a portion of segment select region SSR2 and a portion of array region AR2 that illustrates the formation of a series of word lines WL1-WLn and a series of segment select lines SSL1-SSLn.

After the poly2/tungsten silicide composite has been etched, the poly2 mask is UV-hardened and a self-aligned etch mask SAEM is formed so that the overlying poly2 word lines WL1-WLn can be used as a mask for the self-aligned etch of the ONO/poly1 composite. This is followed by a stacked etch to define the poly1 floating gates.

Figure 23:
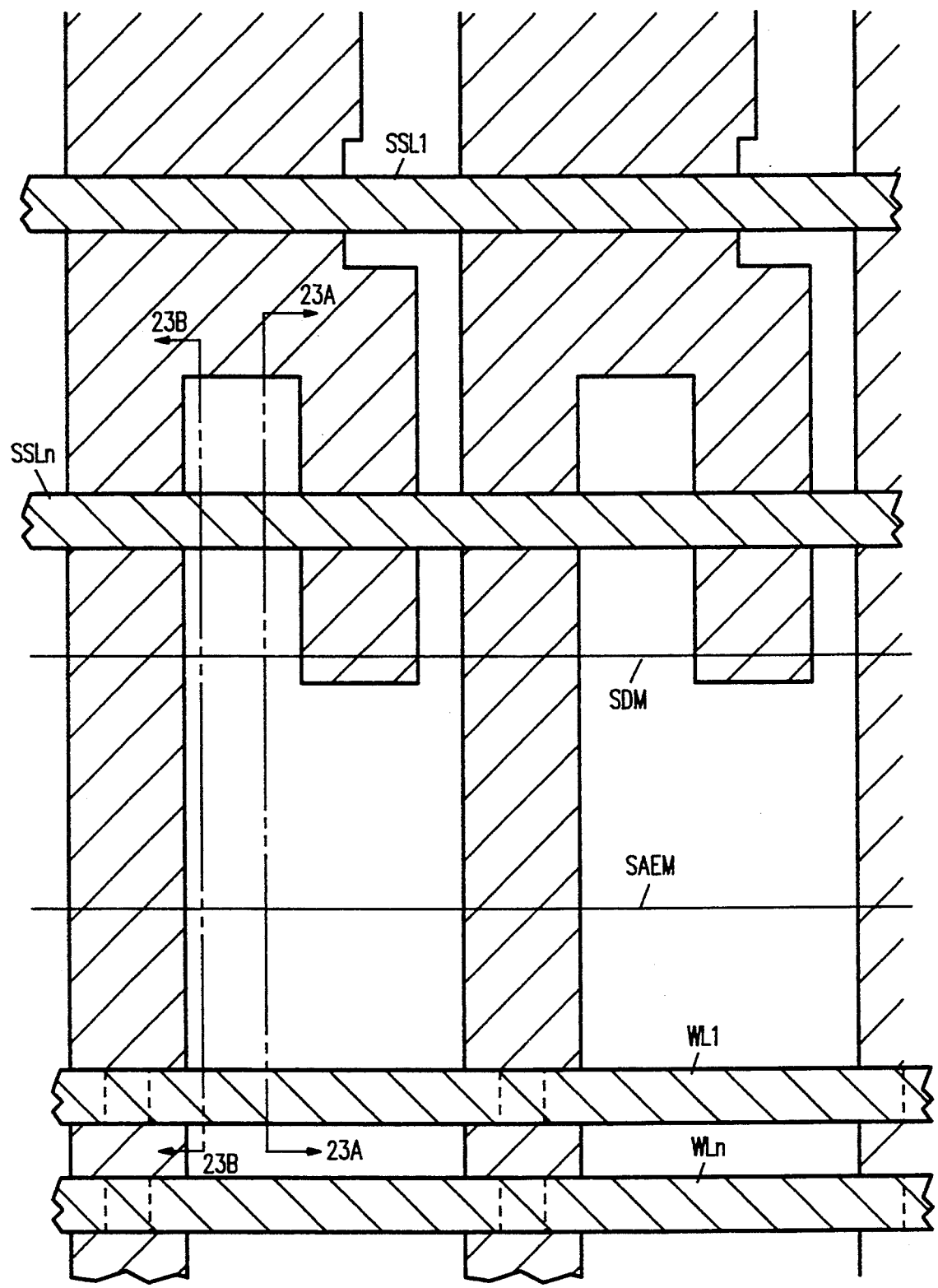
FIG. 23 is a plan view of a portion of segment select region SSR2 and a portion of array region AR2 illustrating the resulting structure following the stacked etch.
Figure 24:
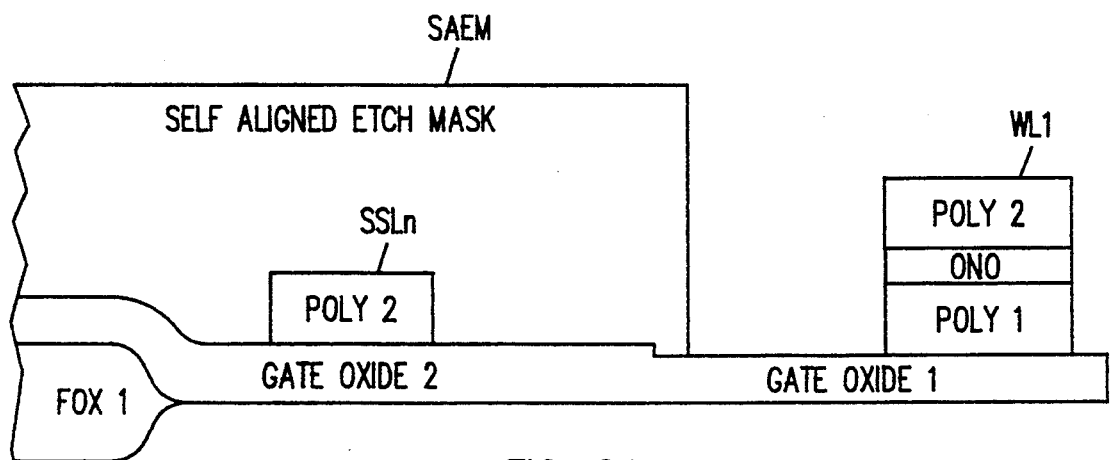
FIGS. 24 and 25 are cross-sectional diagrams of lines 23A—23A and 23B—23B of FIG. 23.
Figure 25:
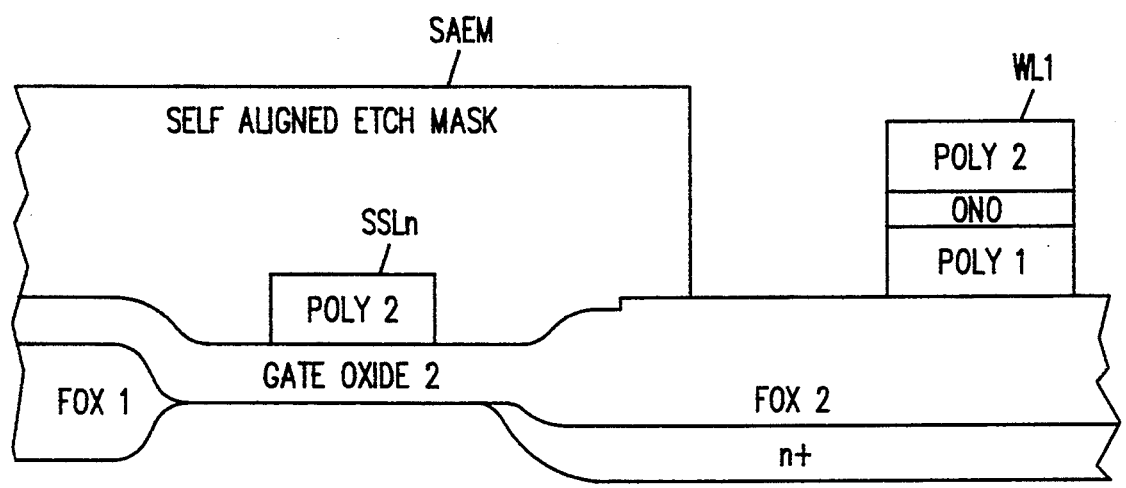

FIG. 23 shows a plan view of a portion of segment select region SSR2 and a portion of array region AR2 that illustrates the resulting structure following the stacked etch. FIGS. 24 and 25 show cross-sectional diagrams of lines 23A—23A and 23B—23B of FIG. 23.

Figure 26:
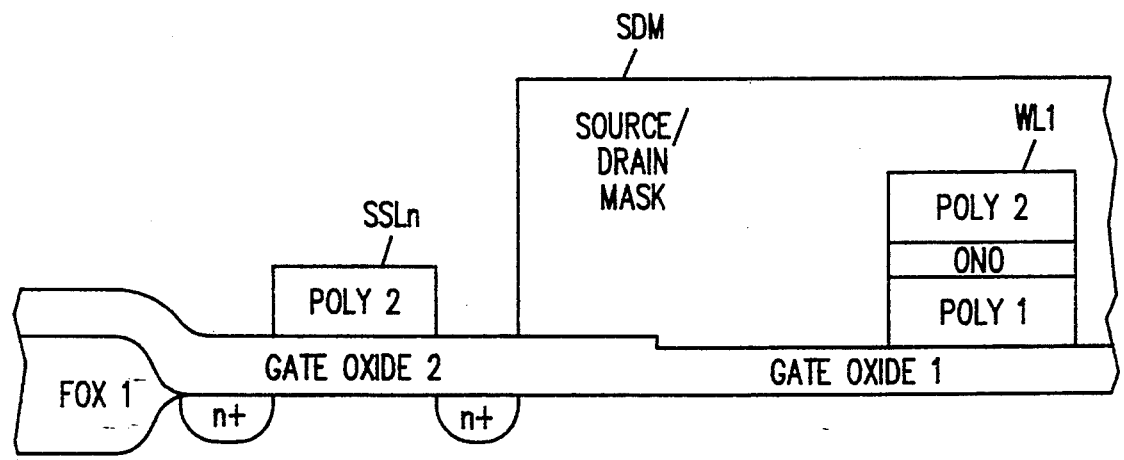
FIGS. 26 and 27 are cross-sectional diagrams of lines 23A—23A and 23B—23B of FIG. 23 illustrating the formation of the N+ source and drain regions.
Figure 27:
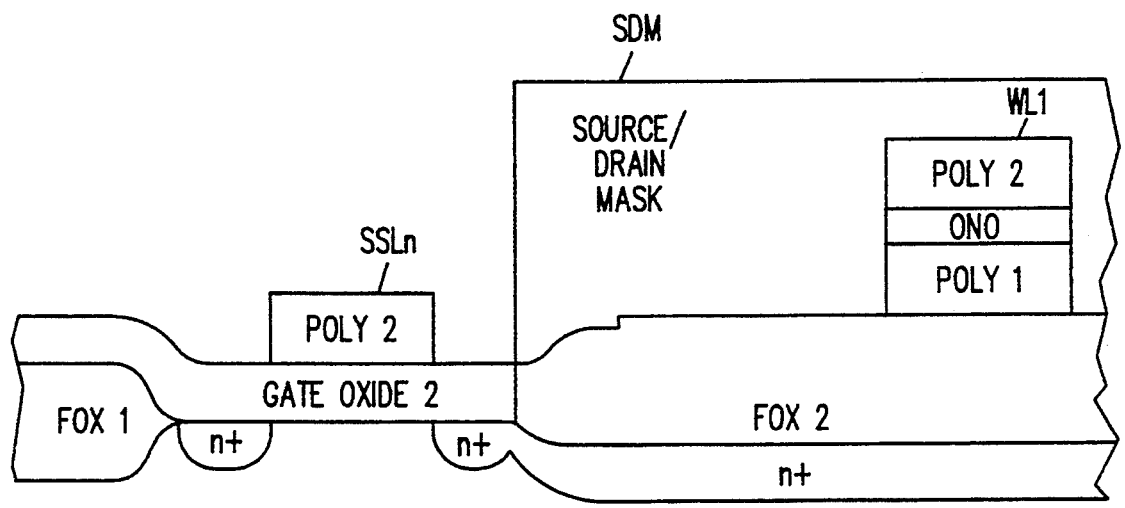

After the self-aligned etch of the ONO/poly1 composite, the self-aligned etch mask SAEM is removed and a source/drain mask SDM is formed and patterned to define the N+ source and drain regions of each of the to be formed segment select transistors. Once the source/drain mask SDM has been formed, arsenic is implanted through the layer of second gate oxide GATE OXIDE 2. FIGS. 26 and 27 show cross-sectional diagrams of lines 23A—23A and 23B—23B of FIG. 23 that illustrate the formation of the N+ source and drain regions. After the source and drain regions have been formed, the process of the present invention continues with the steps of the co-pending application as described above.

Table 2, in conjunction with Table 1, provides conditions necessary to operate the EEPROM device of the present invention.

TABLE 2

|  | Segment Ln SG1 | Segment Ln SG2 | Segment Ln SG3 | Segment Ln SG4 |
|---|---|---|---|---|
| Write | Vss | Vpp | Vpp | Vss |
| WL Write Inhibit | Vss | Vpp | Vpp | Vss |
| BL Write Inhibit | Vss | Vpp | Vpp | Vss |
| Erase | Vss | Vpp | Vpp | Vss |
| BL Erase Inhibit | Vss | Vpp | Vpp | Vss |
| Read | Vss | Vcc | Vcc | Vss |

More specifically, with reference to FIG. 28, the programing conditions are as follows. To program cell A, word line WL1 is held at the programing voltage $V_{pp}$. Segment lines SG1 and SG4, which represent non-selected segments, are held at the low voltage $V_{SS}$ while segment lines SG2 and SG4, which represent the selected segment, are held at the programing voltage $V_{PP}$. Bit line $BL_n$ and bit line $BL_{n'}$ are held at the low supply voltage $V_{ss}$. The P-well is also held at $V_{ss}$. This creates an inversion layer of minority carriers in the channel, causing electrons to tunnel to the floating gate.

During this operation, cell C is program-inhibited by holding word line WL2 at $V_{ss}$, bit line $BL_n$ and $BL_{n'}$ at $V_{ss}$ and the P-well at $V_{ss}$. Furthermore, cell B is program inhibited by holding word line WL1 at $V_{pp}$ and raising bit line $BL_{n+1}$ and $BL_{n'+1}$ to the programing voltage, while the P-well is held at $V_{ss}$. This avoids the occurrence of any minority carriers at the P-well surface under the floating gate; the only minority carrier generation is thermal and all of these electrons are evacuated from the P-well 12 by the bit line/P-well and N-/P-well reverse bias junctions.

Figure 28:
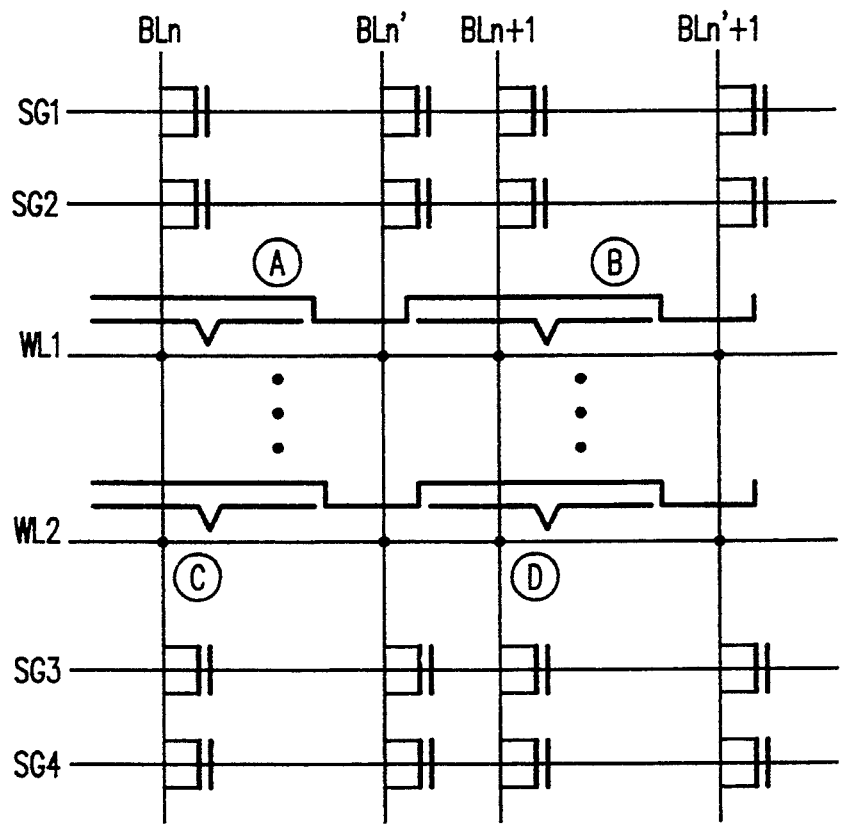
FIG. 28 is a plan view illustrating a portion of an EEPROM array that includes segment select lines SG1-SG4.

With continuing reference to FIG. 28, in accordance with another aspect of the present invention, the erase conditions for the above-described cell are as follows. To erase cell A and its associated byte or word line, word line WL1 is held at $V_{ss}$ while bit lines $BL_n$ and $B_{Ln'}$ and $BL_{n+1}$ and $BL_{n'+1}$, as well as the P-well, are held at the programing voltage Vpp. Segment lines SG1 and SG4 are held at the low voltage $V_{SS}$ while segment select lines SG2 and SG3 are held at the programing voltage $V_{pp}$. During this operation, cell C is erase inhibited by holding word line WL2 at the programing voltage.

It should be understood that various alternatives to the embodiments of the invention described herein may be employed in practicing the invention. It is intended that the following claims define the scope of the inven-

What is claimed is:

1. An electrically-erasable, programmable read-only-memory (EEPROM) array, the EEPROM array comprising:
   a semiconductor material having a plurality of adjacent segment select regions and a plurality of adjacent array regions arranged so that one array region is located between and adjoins each pair of adjacent segment select regions;
   a plurality of spaced-apart strips of first field oxide formed on the semiconductor material so that a portion of each strip is formed in each segment select region and in each array region, each pair of adjacent strips of first field oxide in each array region defining an active device region therebetween;
   a plurality of bit lines formed in the semiconductor material in each pair of adjacent segment select regions and the adjoining array region located therebetween so that a pair of bit lines are formed between and adjacent to each pair of adjacent strips of first field oxide;
   a layer of second field oxide formed on the semiconductor material over each bit line;
   a plurality of spaced-apart first channel regions positioned within the semiconductor material in each active device region so that each first channel region is formed between and adjoins the pair of bit lines formed therein;
   a layer of first gate dielectric material formed on the semiconductor material in each of the array regions, the layer of first gate dielectric material having a plurality of tunnel openings which are positioned so that each tunnel opening overlies a portion of one first channel region;
   a layer of tunnel dielectric material formed in each tunnel opening of the layer of first gate dielectric material;
   a plurality of floating gate structures, each floating gate structure formed on the layer of first gate dielectric material over one of the first channel regions, each floating gate structure comprising a layer of first conducting material and an overlying layer of intermediate dielectric material;
   a plurality of second channel regions positioned within the semiconductor material in each segment select region;
   a layer of second gate dielectric material formed on the semiconductor material in each of the segment select regions;
   a plurality of segment select lines formed over the layer of second gate dielectric material orthogonal to the plurality of buried bit lines so that each segment select line overlies a plurality of second channel regions, the portion of each segment select line overlying each second channel region forming a control gate;
   a plurality of word lines formed orthogonal to the plurality of buried bit lines so that each word line overlies a plurality of floating gate structures; and
   a plurality of source regions formed in the semiconductor material in each segment select region, each source region being formed between and adjoining one second channel region and one bit line; and
   a plurality of drain regions formed in the semiconductor material in each segment select region, each drain region adjoining one second channel region on a side opposite to a source region.

2. An EEPROM array as in claim 1 wherein the first gate dielectric material, the second gate dielectric material, and the tunnel dielectric material comprise silicon dioxide.

3. An EEPROM array as in claim 2 wherein the first conductive material comprises polysilicon.

4. An EEPROM array as in claim 3 wherein the intermediate dielectric material comprises oxide/nitride/oxide composite.

5. An EEPROM array as in claim 4 wherein each wordline comprises a layer of second conductive material and an overlying layer of third conductive material.

6. An EEPROM array as in claim 5 wherein the second conductive material comprises polysilicon and the third conductive material comprises tungsten silicide.

7. AN EEPROM array as in claim 6 wherein the semiconductor material comprises a well of P-type conductivity formed in a silicon substrate of N-type conductivity.

* * * * *